United States Patent
Meissner et al.

(10) Patent No.: US 12,487,417 B2
(45) Date of Patent: Dec. 2, 2025

(54) PHOTONIC GLASS LAYER SUBSTRATE WITH EMBEDDED OPTICAL STRUCTURES FOR COMMUNICATING WITH AN ELECTRO OPTICAL INTEGRATED CIRCUIT

(71) Applicant: Applied Materials, Inc., Santa Clara, CA (US)

(72) Inventors: Paul Meissner, San Jose, CA (US); Anup Pancholi, Hillsboro, OR (US); Ronald Huemoeller, Phoenix, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 186 days.

(21) Appl. No.: 17/959,973

(22) Filed: Oct. 4, 2022

(65) Prior Publication Data
US 2024/0111106 A1     Apr. 4, 2024

(51) Int. Cl.
*G02B 6/42* (2006.01)

(52) U.S. Cl.
CPC ......... *G02B 6/4246* (2013.01); *G02B 6/4206* (2013.01)

(58) Field of Classification Search
CPC ... G02B 6/4214; G02B 6/4202; G02B 6/4206
See application file for complete search history.

(56) References Cited

U.S. PATENT DOCUMENTS

| | | | | |
|---|---|---|---|---|
| 6,655,854 B1 * | 12/2003 | Nguyen | ............... | G02B 6/4202 438/26 |
| 6,768,826 B2 * | 7/2004 | Ayadi | .................. | G02B 6/4249 385/14 |
| 7,091,589 B2 | 8/2006 | Mori et al. | | |
| 7,129,117 B2 | 10/2006 | Hsu | | |
| 7,271,012 B2 | 9/2007 | Anderson | | |
| 7,274,099 B2 | 9/2007 | Hsu | | |
| 7,312,405 B2 | 12/2007 | Hsu | | |
| 8,518,746 B2 | 8/2013 | Pagaila et al. | | |

(Continued)

FOREIGN PATENT DOCUMENTS

| | | |
|---|---|---|
| CN | 100524717 C | 8/2009 |
| EP | 4148780 A1 | 3/2023 |

(Continued)

OTHER PUBLICATIONS

PCT Notification of Transmittal of the International Search Report and the Written Opinion of the International Searching Authority for International Application No. PCT/US2023/033205; dated Jan. 5, 2024.

*Primary Examiner* — Rhonda S Peace
(74) *Attorney, Agent, or Firm* — Patterson + Sheridan, LLP

(57) ABSTRACT

Embodiments described herein relate to electronic and photonic integrated circuits and methods for fabricating integrated interconnect between electrical, opto-electrical and photonic devices. One or more optical silicon photonic devices described herein may be used in connection with one or more opto-electrical integrated circuits (opto-electrical chip) on a single package substrate to from a co-packaged optical and electrical device. The methods described herein enable high volume manufacturing of electrical, opto-electrical and the optical silicon photonic devices having a plurality of optical structures, such as waveguides, formed on or integral with a photonic glass layer substrate.

20 Claims, 12 Drawing Sheets

(56) References Cited

U.S. PATENT DOCUMENTS

| | | | |
|---|---|---|---|
| 8,890,628 B2 | 11/2014 | Nair et al. | |
| 9,417,415 B2 | 8/2016 | Tummala et al. | |
| 9,804,334 B2* | 10/2017 | Israel | G02B 6/30 |
| 10,177,083 B2 | 1/2019 | Kim et al. | |
| 10,288,812 B1* | 5/2019 | Evans | G02B 6/30 |
| 10,705,302 B2* | 7/2020 | Ji | G02B 6/30 |
| 10,742,217 B2 | 8/2020 | Dabral et al. | |
| 10,823,921 B2 | 11/2020 | Islam et al. | |
| 10,895,682 B1* | 1/2021 | Barwicz | H05K 7/20163 |
| 11,076,491 B2 | 7/2021 | Pun et al. | |
| 11,156,790 B2* | 10/2021 | O'Brien | G02B 6/4239 |
| 11,282,795 B2 | 3/2022 | Kim | |
| 11,302,683 B2 | 4/2022 | Pan et al. | |
| 11,307,368 B2 | 4/2022 | Goergen | |
| 11,417,597 B2 | 8/2022 | Kim et al. | |
| 11,450,587 B2 | 9/2022 | Gavagnin et al. | |
| 11,450,612 B2 | 9/2022 | Lin et al. | |
| 11,476,188 B2 | 10/2022 | McKnight-MacNeil | |
| 11,527,501 B1 | 12/2022 | Elsherbini et al. | |
| 11,545,440 B2 | 1/2023 | Kwon | |
| 11,600,932 B2 | 3/2023 | Tang et al. | |
| 11,782,225 B2* | 10/2023 | Schaevitz | G02B 6/423 385/31 |
| 11,852,876 B2* | 12/2023 | Taha | G02B 6/3652 |
| 12,189,195 B2* | 1/2025 | Taha | G02B 6/4292 |
| 2004/0114869 A1* | 6/2004 | Fike | G02B 6/1228 385/28 |
| 2014/0203175 A1 | 7/2014 | Kobrinsky et al. | |
| 2014/0314370 A1* | 10/2014 | Hatori | G02B 6/12 385/14 |
| 2016/0116688 A1* | 4/2016 | Hochberg | G02B 6/4232 385/14 |
| 2018/0239095 A1* | 8/2018 | Wade | G02B 6/423 |
| 2019/0285804 A1 | 9/2019 | Ramachandran et al. | |
| 2020/0132930 A1 | 4/2020 | Bchir | |
| 2021/0035911 A1 | 2/2021 | Ganesan et al. | |
| 2021/0149128 A1* | 5/2021 | Schaevitz | G02B 6/423 |
| 2021/0193637 A1 | 6/2021 | Jeng et al. | |
| 2021/0407909 A1 | 12/2021 | Jadhav et al. | |
| 2022/0080454 A1 | 3/2022 | Shang et al. | |
| 2022/0148953 A1 | 5/2022 | Kim et al. | |
| 2022/0155539 A1 | 5/2022 | Pietambaram et al. | |
| 2022/0189839 A1 | 6/2022 | Eid et al. | |
| 2022/0299703 A1 | 9/2022 | Delrosso | |
| 2022/0310532 A1 | 9/2022 | Yeh et al. | |
| 2022/0334310 A1 | 10/2022 | Yu et al. | |
| 2022/0394849 A1 | 12/2022 | Kamgaing | |
| 2022/0413210 A1* | 12/2022 | Liu | G02B 6/4204 |
| 2022/0416391 A1 | 12/2022 | Kamgaing et al. | |
| 2023/0086356 A1 | 3/2023 | Collins et al. | |
| 2023/0086881 A1 | 3/2023 | Bryks et al. | |
| 2023/0087124 A1 | 3/2023 | Nie et al. | |
| 2023/0107096 A1 | 4/2023 | Grujicic et al. | |
| 2024/0111106 A1* | 4/2024 | Meissner | G02B 6/4292 |
| 2024/0111107 A1* | 4/2024 | Meissner | G02B 6/4249 |
| 2025/0147251 A1* | 5/2025 | Brusberg | G02B 6/4274 |
| 2025/0172766 A1* | 5/2025 | Huang | G02B 6/30 |

FOREIGN PATENT DOCUMENTS

| | | |
|---|---|---|
| KR | 100927592 B1 | 11/2009 |
| WO | 2023018569 A1 | 2/2023 |

\* cited by examiner

PHOTONIC GLASS LAYER SUBSTRATE WITH EMBEDDED OPTICAL STRUCTURES FOR COMMUNICATING WITH AN ELECTRO OPTICAL INTEGRATED CIRCUIT

BACKGROUND

Field

Embodiments of the present invention generally relate to silicon electronic and photonic integrated circuits and co-packaged optical and electrical devices. More particularly, the present disclosure pertains to an apparatus for co-packaging optical silicon photonic and electrical devices and methods of fabricating optical structures for optical silicon photonic devices.

Description of the Related Art

With increasing data traffic network demands, networking companies previously using the traditional copper cable for communication have sought out more efficient solutions that could be deployable on a massive scale. Today, optical fiber technologies dominate the long-distance communications space. Networking companies have gradually been transitioning to using optical fibers to transmit data across shorter and shorter distances, even within clusters of devices and device to device or chip to chip. With the use of optical fibers, data is transmitted as photons at the speed of light and can be transmitted at a range of data rates, including at super-high frequencies, thereby allowing for higher data volume transmissions.

Along with data traffic network demand increases, there is also a demand for ever-increasing data rates in electronic systems and communications. One area of improvement that can help the semiconductor industry as it balances the challenges of ever-increasing integrated circuit operating speeds and chip solutions that can address increasing data traffic networks demands, is improvements in interconnect speeds with higher physical density and lower power use and dissipation. The typical electrical interconnect solution between transistors on traditional integrated circuits is currently still electrons through metals. The issue with use of metal, for communication and data transmission in general is density, timing, and resistive heating due to the electron transport. These sources of degraded performance and loss produce a motivation to reduce the use and length of metal interconnects and wires for communication and data transfer I/O (input output) technologies. One approach to minimize the use of metal interconnects is to co-package multiple chips and modules with optics in a single or nearby package substrates which includes multiple integrated electrical and optical circuit devices assembled closely together. Such multi-chip modules have been explored but a large fraction of high performance interconnect relies on metal wiring to transmit data to and from chips, packages, substrates, and printed circuit boards.

Another approach to minimize the use of metal wiring and other metallization schemes for electron transport in high speed device communication systems is the integration with optical devices and communication system technologies which have proven to be more advantageous than metal for communication and data transmission due to higher density and data rates combined with lower length-dependence and power use and dissipation. In addition, there is a trend towards, optical components being integrated on silicon (Si) substrates for fabricating large-scale photonics integrated circuits, as well as packaging those photonic integrated circuits so that they can co-exist with micro-electronic chips. Due to the inherent materials properties of Silicon, optical communications technologies typically involve different materials and fabrication processes than traditional Silicon chip based electronic communications technologies. However, silicon photonics technologies have brought optical communications technologies together with electronics technologies based on a common material platform. As an example, in optical transceivers for Data Center Interconnect (DCI) applications, a received optical signal can be converted to an electrical signal capable of being processed by an integrated circuit, or the processed electrical signal can be converted to an optical signal to be transmitted via an optical fiber using a photonic integrated circuit.

Accordingly, what is needed in the art are improved co-packaged optical photonic and electrical device technologies and methods of fabrication.

SUMMARY

Embodiments of the present disclosure generally relate to photonic integrated interconnect substrates and methods for forming optical structures on those substrates used for those devices, including the interconnection to electronic circuits within a multi-chip assembly as well as between multi-chip assemblies at various distances from each other.

In one embodiment, an electro-photonic device assembly is provided having a substrate with a chip mounting region that is configured to receive a photonic transceiver chip (providing electrical to optical and optical to electrical conversion among other functions) and a fiber connector region that is configured to be coupled to a fiber connector. The substrate further includes a plurality of optical structures between the photonic transceiver chip and the fiber connector with each of the plurality of optical structures being operable to transmit light between a first end of each of the plurality of optical structures that are configured to receive light transmitted from a plurality of waveguides of the optical transceiver chip or light that is to be received by the waveguides of the optical transceiver chip, and a second end of each of the plurality of optical structures that are configured to receive light transmitted from a plurality of optical fibers of the fiber connector or light that is to be received by the optical fibers of the fiber connector that is connected to the substrate.

In another embodiment, a co-packaged electronic and photonic device is provided. The co-packaged electronic and photonic device includes a package substrate, one or more electrical or opto-electrical integrated circuits mounted on the package substrate, and one or more electronic and photonic devices mounted on the package substrate with each of the one or more electronic and photonic devices connected to one or more of the electrical or opto-electrical integrated circuits. Each of the one or more electronic and photonic devices also includes a supporting substrate having an optical transceiver chip mounting region that is configured to receive an optical transceiver chip and a fiber connector region that is configured to be coupled to a fiber connector. The supporting substrate of the one or more electronic and photonic devices also includes a plurality of optical structures that are formed within the supporting substrate and are operable to transmit light between a first end and a second end of the supporting substrate.

In one embodiment, a method for fabricating an electronic and photonic device is provided. The method includes depositing a patterned layer over a surface of a substrate comprising a photonic glass layer, the photonic glass layer having a first refractive index and the patterned layer having openings formed therein in which portions of the surface of the substrate are exposed. Then, portions of the substrate exposed within the openings of the patterned layer are removed to form a plurality of structures in the substrate separated by a plurality of trenches. The method then continues with removing the patterned layer and depositing a fill layer having a second refractive index that is different from the first refractive index over the plurality of structures and into the plurality of trenches to form a plurality of optical structures. Each of the plurality of optical structures includes a waveguide configured to transmit light between a first edge and a second edge of the substrate, and wherein each of the waveguides of the plurality of optical structures extend in one or more directions extending between the first edge and the second edge.

In one aspect of the above method, the method includes forming a chip mounting region on a surface of the photonic glass layer at the first edge of the substrate, wherein the chip mounting region is operable to connect a photonic or electronic integrated circuit to the photonic glass layer substrate.

In another aspect of the above method, the method includes forming a fiber connector on a surface of the photonic glass layer at the second edge of the substrate, wherein the fiber connector is operable to connect an optical fiber cable to the photonic glass layer substrate.

In one aspect of the above method, the method includes depositing a patterned layer over the surface of the substrate. Depositing the patterned layer includes depositing a patterned hardmask or forming a patterned photoresist over the substrate.

In another aspect of the above method, depositing the patterned layer over the surface of the substrate includes depositing a hardmask over the surface of the substrate, forming a patterned photoresist over the hardmask, the patterned photoresist having openings formed therein in which portions of the hardmask are exposed, and removing the exposed portions of the hardmask to expose portions of the surface of the substrate.

In one aspect of the above method, depositing the fill layer includes depositing one or more of a high-index material including one or more of amorphous silicon, crystalline silicon, silicon nitride, titanium dioxide, gallium phosphide, tantalum pentoxide, gallium nitride, sulfur-inated materials, polymers, and other materials with appropriate optical properties.

In another embodiment, a method for fabricating an electronic and photonic device is provided. The method includes depositing a patterned layer over a surface of a substrate comprising a photonic glass layer, the photonic glass layer having a first refractive index and the patterned layer having openings formed therein in which portions of the surface of the substrate are exposed. The method then continues with performing an ion implantation process on the exposed portions of the substrate to implant a plurality of doping ions into the surface of the exposed portions of the substrate. The exposed portions of the substrate that include the plurality of doping ions define a plurality of optical structures having a second refractive index different from the first refractive index. Each of the plurality of optical structures also include a waveguide configured to transmit light between a first edge and a second edge of the substrate, and wherein each of the waveguides of the plurality of optical structures extend in one or more directions extending between the first edge and the second edge.

In one aspect of the above method, depositing the patterned layer includes depositing a patterned hardmask or forming a patterned photoresist over the substrate.

In another aspect of the above method, each of the waveguides of the plurality of optical structures includes a first end extending from the first edge of the substrate, the first ends of the waveguides having a cross-sectional dimension with a height dimension that is about 1 micron in size.

In yet another aspect of the above method, each of the waveguides of the plurality of optical structures includes a second end extending from the second edge the substrate, the second ends of the waveguides having a cross-sectional dimension having a height dimension that is about 9 micron in size.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
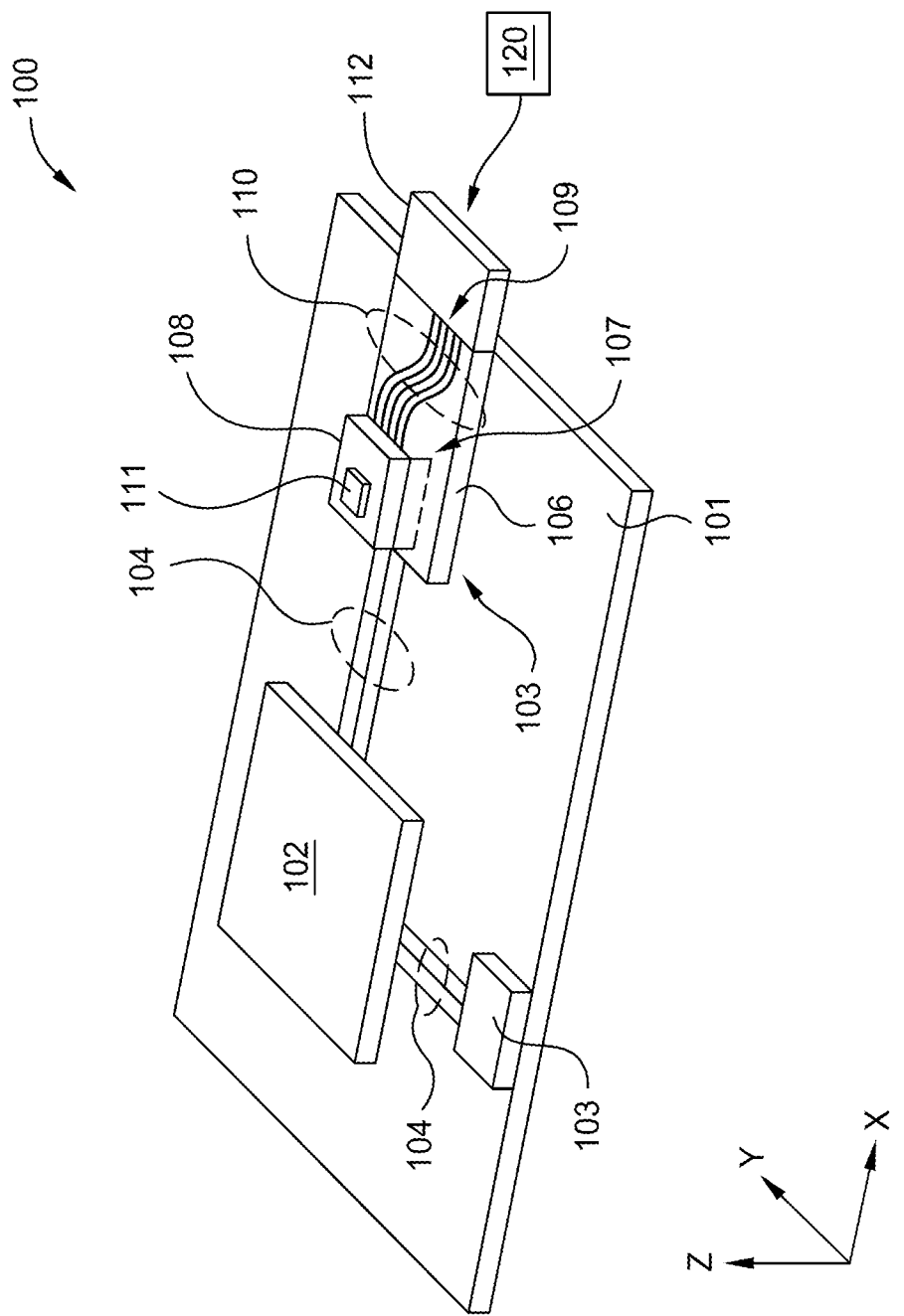
FIG. 1 is a perspective view of at least a portion of a co-packaged substrate having one or more electrical and photonic devices formed thereon, according to an embodiment.

Embodiments described herein relate to electronic and photonic integrated circuits and methods for fabricating integrated interconnect between electrical, opto-electrical and photonic devices. One or more optical silicon photonic devices described herein may be used in connection with one or more opto-electrical integrated circuits (opto-electrical chip) on a single package substrate to from a co-packaged optical and electrical device. The methods described herein enable high volume manufacturing of electrical, opto-electrical and the optical silicon photonic devices having a plurality of optical structures, such as waveguides, formed on or integral with a photonic glass layer substrate.

One embodiment of the co-packaged optical and electrical device described herein includes the package substrate formed with one or more optical silicon photonic devices and one or more opto-electrical chips. The one or more optical silicon photonic devices are connected to one or more opto-electrical chips and provides an interface to operably connect the opto-electrical chip to an external network fiber connection plugged into the optical silicon photonic device. The methods described herein provide for a scalable process for fabricating the optical silicon photonic device with optical structures of varying sizes, materials, and properties on or integral with the photonic glass layer substrate. The fabrication of the optical silicon photonic devices described herein may also be configurable based on varying the electro optical photonic circuit and network fiber connection properties the optical silicon photonic device may be used with.

As used herein, the term "about" refers to a +/−10% variation from the nominal value. It is to be understood that such a variation can be included in any value provided herein.

In various embodiments of the present disclosure, layers or other materials are referred to as being deposited. It is understood that the deposition of these materials can be performed using any conventional methods used in semiconductor manufacturing, such as, but not limited to, chemical vapor deposition (CVD), atomic layer deposition (ALD), physical vapor deposition (PVD), electroplating, electroless plating, the selective deposition of any of the above, combinations of the above, and any other suitable method. It is to be understood that when a method operation is described herein as depositing a material in two or more separate locations, the depositions can occur simultaneously, or the material can be deposited in separate sub operations.

In various embodiments of the present disclosure, layers or other materials are referred to as being etched. It is understood that the etching of these materials can be performed using any conventional methods used in semiconductor manufacturing, such as, but not limited to, reactive ion etching (RIE), dry etching, wet etching, or laser ablation, combinations of the above, and any other suitable method of removing material. It is to be understood that when a method operation is described herein as etching two or more types of materials, the etching can occur simultaneously with the same etching process, or the etching can be performed in separate sub-operations using different etching processes. For example, an operation describing etching a metal and a dielectric includes a first etching sub operation using a first etching process that etches the metal, and the operation further includes a second etching sub operation using a second etching process that etches the dielectric.

FIG. 1 is a perspective view of a portion of exemplary co-packaged optical and electrical devices 100 comprising an electrical or opto-electrical chip 102 connected by a plurality of optical waveguide or electrical trace interconnect 104 to a photonic integrated interconnect unit 103 where all are formed on or disposed on a package substrate 101. In an embodiment, the electrical or opto-electrical chip 102 may include any high-density chip having a high I/O pin count. In one example, the high-density chip has between 100 and 2000 I/O pins or up to and greater than 2000 I/O pin counts. Examples of electrical or opto-electrical chips 102 include but not limited to data center SWITCH chips, artificial intelligence (AI) chips, and the like.

The photonic integrated interconnect unit 103 includes a fiber connector region configured to be coupled to a fiber connector 112 for removably connecting a fiber cable 120 to the photonic integrated interconnect unit 103. In an embodiment, the fiber cable 120 may be plugged into the fiber connector 112 to operably connect the fiber cable 120 to the co-packaged optical and electrical devices 100. In an embodiment, the photonic integrated interconnect unit 103 is configured for connecting fiber cables 120 including, but not limited to, single-mode fiber optic cables having 9 micron fiber core diameters. The fiber connector 112 may further include a plurality of optical fibers 112A (FIG. 10) to operably connect fiber cables 120 having between 1 to 74 fiber cores, 74 to 148 fiber cores, and up to and greater than 148 fiber cores to the photonic integrated interconnect unit 103.

In an embodiment, the photonic integrated interconnect unit 103 in the set of co-packaged electrical and optical devices 100 is configured to transmit signals between the electrical or opto-electrical chip 102 and the fiber cable 120 connected to the photonic integrated interconnect unit 103. The photonic integrated interconnect unit 103 includes a photonic glass layer (PGL) substrate 106, a plurality of optical structures $110_1$-$110_N$ formed integral with or on the PGL substrate 106, an optical transceiver integrated circuit (SiPho chip) 108 mounted on the PGL substrate 106 and coupled to the plurality of optical structures $110_1$-$110_N$ at a first interface 107, and the fiber connector 112 connected to both the PGL substrate 106 and the plurality of optical structures $110_1$-$110_N$ at a second interface 109.

In an embodiment, the SiPho chip 108 in the photonic integrated interconnect unit 103 operates to convert electrical signals to optical signals, and vice versa. The plurality of optical structures $110_1$-$110_N$ in the photonic integrated interconnect unit 103 operate to transmit optical signals between the SiPho chip 108 and the fiber connector 112, and the optical waveguide or electrical trace interconnect 104 operate to transmit electrical or optical signals between the photonic integrated interconnect unit 103 (specifically, the SiPho chip 108) and the electrical or opto-electrical chip 102. The optical waveguide or electrical trace interconnect 104 can include metal traces that are formed within the package substrate 101, which in some embodiments can include metal traces formed in a printed circuit board (PCB) substrate or metal traces formed within a plurality of redistribution layers (e.g., dielectric containing layers) formed over a solid core substrate (e.g., silicon or glass core substrate).

The photonic engine 103 may optionally further include one or more electronic phy chips 111 that are coupled to the SiPho chip 108. The electronic phy chip 111 is generally used to assist with operations performed by an optical chip. In one embodiment, the electronic phy chip 111 is operably connected to the SiPho chip 108 to assist the SiPho chip 108 with various electrical functions. As shown, the electronic phy chip 111 may be mounted on top of the SiPho chip 108 and thereby directly connected to the SiPho chip 108. Alternatively, the electronic phy chip 111 may be embedded in the PGL substrate 106 and connected to the SiPho chip 108 through the PGL substrate 106, which is often simply referred to herein as a substrate 106. Further, the electronic phy chip 111 can be mounted on or embedded in the package substrate 101 and connected to the SiPho chip 108 through electrical interconnect 104.

Figure 2A:
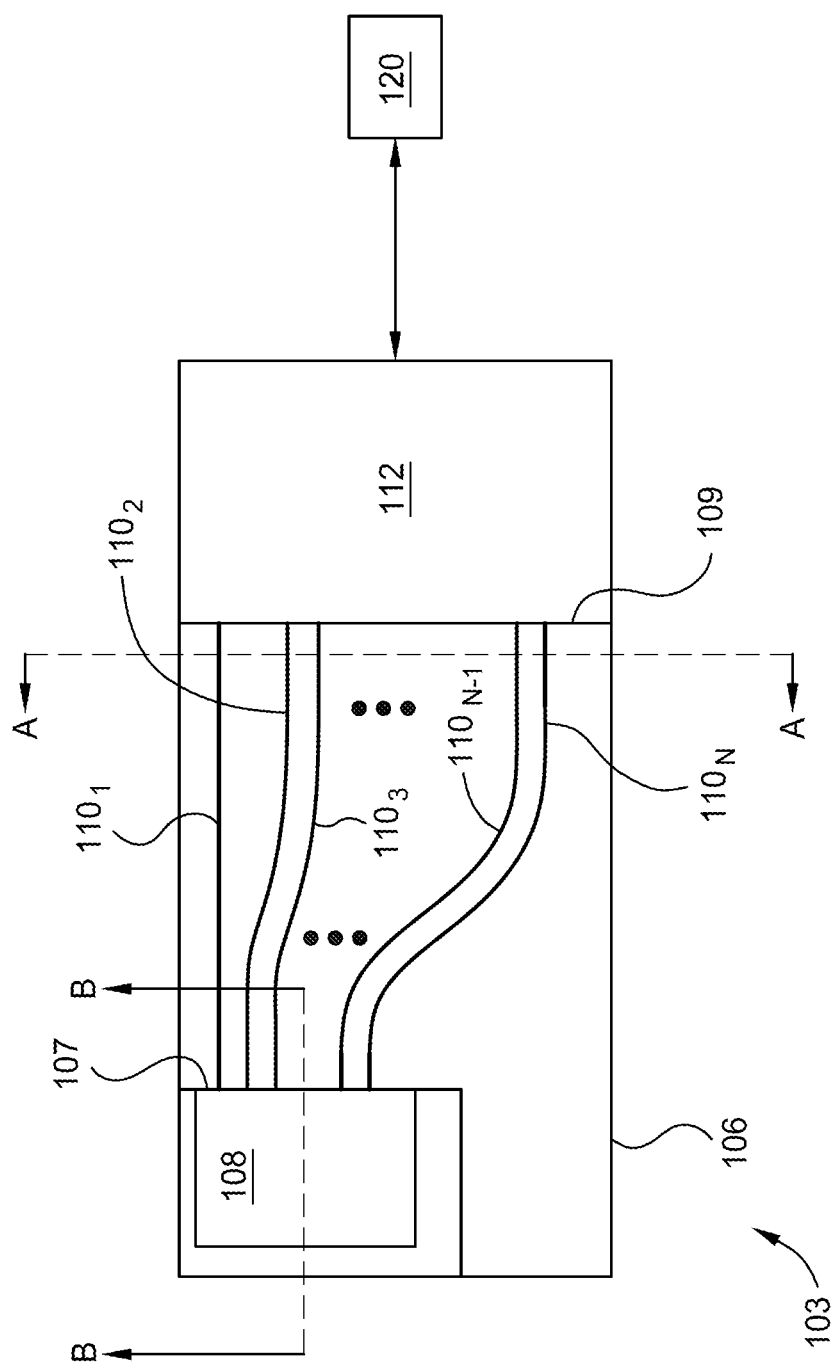
FIGS. 2A and 2B are top views of a photonic engine, according to an embodiment.
Figure 2B:
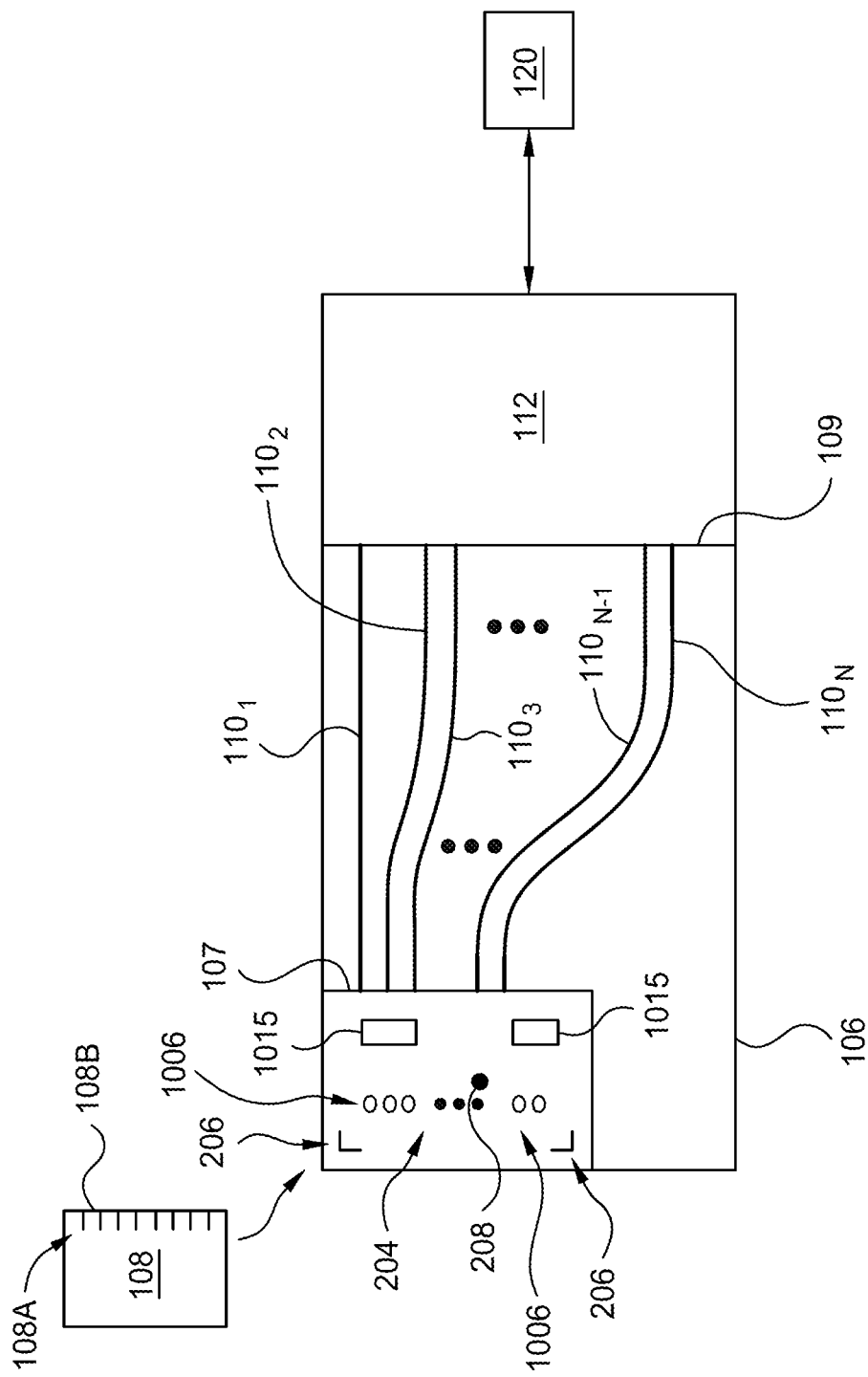

FIGS. 2A and 2B are top views of the photonic engine 103 according to an embodiment. In some embodiments, as shown in FIG. 2A, the photonic engine 103 includes the SiPho chip 108 mounted near one end of the PGL substrate 106, the fiber connector 112 connected at an opposite end of the PGL substrate 106 from the SiPho chip 108, and the plurality of optical structures $110_1$-$110_N$ extending between the SiPho chip 108 and the fiber connector 112. In an embodiment, each of the plurality of optical structures $110_1$-$110_N$ include a light transmitting region for transmitting light in either direction between the first interface 107 and the second interface 109. The light being transmitted through the optical structures can be either received from one or more of a plurality of waveguides 108A (FIG. 2B) of the SiPho chip 108 or received from one or more of a plurality of optical fibers within the fiber connector 112 that a light signal source is in communication with during use. The SiPho chip 108 is typically configured to receive light (e.g., detect) transmitted through the optical structures $110_1$-$110_N$ and also emit light (e.g., transmit) into the optical structures $110_1$-$110_N$ in an effort to communicate with external devices connected through the fiber connector 112. The SiPho chip 108 can be configured to transmit light into the optical structures $110_1$-$110_N$ by at least the use of light emitters integrated into SiPho chip 108, or by use of light emitters that are external to PGL substrate 106. In the case where the light emitters are external to PGL substrate 106 the light is delivered to SiPho chip 108 via the optical structures $110_1$-$110_N$ and then modulated by the SiPho chip 108 to create a transmit signal that is provided to the optical structures $110_1$-$110_N$.

In some embodiments, which can be combined with other embodiments described herein, the plurality of optical structures $110_1$-$110_N$ are formed on (e.g. directly or indirectly) or are integral with the PGL substrate 106. Each of the plurality of optical structures $110_1$-$110_N$ in the photonic engine 103 may be formed by one of various methods described herein.

In one embodiment, which can be combined with other embodiments described herein, the light transmitting region within each of the plurality of optical structures $110_1$-$110_N$ may have the same cross-sectional dimensions, such as height and width. In another embodiment, which can be combined with other embodiments described herein, the light transmitting region within at least one of the plurality of optical structures $110_1$-$110_N$ may have at least one different cross-sectional dimensions, such as one of height and width, from the dimensions of the other optical structures 110 within the PGL substrate 106. In one embodiment, which can be combined with other embodiments described herein, the light transmitting region within each of the plurality of optical structures $110_1$-$110_N$ may have the same refractive index. In another embodiment, which can be combined with other embodiments described herein, the light transmitting region within at least one of the plurality of optical structures $110_1$-$110_N$ may have a different refractive index or multiple different refractive indexes or a gradual gradation of refractive indexes or other index varying structures when compared with the rest of the plurality of optical structures $110_1$-$110_N$ within the PGL substrate 106.

In one aspect, the number of optical structures $110_1$-$110_N$ formed in the PGL substrate 106 is dependent on the number of waveguides 108A in the SiPho chip 108 needing to be connected, which may also correspond with the number of fiber connections needing to be connected to the opto-electrical chip 102. In an embodiment, the opto-electrical chip 102 may comprise seventy-two (72) fiber connections such that seventy-two (72) corresponding interconnects 104 extend from the opto-electrical chip 102 and connect to seventy-two (72) corresponding fibers and waveguides 108A in the SiPho chip 108 of the photonic engine 103. To appropriately connect the SiPho chip 108 to the fiber connector 112 via the plurality of optical structures $110_1$-$110_N$ in the photonic glass layer substrate 106, seventy-two (72) corresponding optical structures 110 are formed on or integral with the PGL substrate 106. In this example, N as shown in FIGS. 2A and 2B will equal 72, and thus the optical structures 110 are spaced apart in the X-Y plane from one edge of the PGL substrate 106 to the other edge of the PGL substrate 106. In this example, optical structure $110_1$ is positioned near the top most edge and optical structure $110_{72}$ would be positioned closest to the bottom most edge of FIG. 2A. As discussed further below, the optical structures $110_1$-$110_N$ are spaced apart and separated by a material that has different optical properties, such as index of refraction (n), than the light transmitting portions of the optical structures $110_1$-$110_N$.

The plurality of optical structures $110_1$-$110_N$ are generally sized and configured to appropriately connect to the plurality of waveguides 108A within the SiPho chip 108. In an embodiment, the plurality of waveguides 108A (FIG. 2B) at the output of the SiPho chip 108, or portion that is to communicate with the optical structures, have a core with a height dimension that is about 1 micron (μm) in cross-sectional size. In one configuration, the output of the SiPho chip 108 has a square or rectangular shaped cross-section that has at least one dimension that is equal to about 1 μm in length. For example, a square cross-section of a waveguide 108A may have a core that is 1 μm height and width. Light transmitted to and from the SiPho chip 108 would thus be transferred through the 1 micron waveguides 108A.

In contrast, light transmitted to and from the fiber cable 120 through the fiber connector 112 can have a different form factor, such as having a core cross-sectional dimension of about 9 μm in size. For example, the fiber connector 112 may have a square, rectangular or circular cross-section with a core having a height dimension that is about 9 μm in size. As such, in some embodiments, each of the plurality of optical structures $110_1$-$110_N$ are formed such that light propagating through the plurality of optical structures $110_1$-$110_N$ between the SiPho chip 108 and the fiber cable 120 is expanded or compressed accordingly depending on the direction of propagation of the optical signal. In one example, the plurality of optical structures $110_1$-$110_N$ extending from the second interface 109 adjacent to the 9 μm fibers in the fiber connector 112 have transmission regions with cross-sectional areas that vary at different portions of the respective structures to facilitate coupling to the plurality of 1 micron waveguides 108A in the SiPho chip 108. In one embodiment, the plurality of optical structures $110_1$-$110_N$ are tapered along at least a portion of their length from a 9

µm dimensional core size until they are near 1 µm dimensional core size near the first interface 107, where it is assumed that the varying dimensional core size relates to a dimension of a side of a square or rectangular cross-sectional shaped optical structure 110. In some embodiments, the tapered optical structures 110 have a cross-sectional area ratio, which if measured at one end versus measured at the opposing end of the optical structure 110 is greater that 1:1 and less than about 1:100, or less than 1:81. In another embodiment, the plurality of optical structures 110$_1$-110$_N$ extending from the second interface 109 adjacent to the fiber connector 112 have a varying refractive index along at least a portion of their length from the second interface 109 to the first interface 107 to facilitate coupling between the optical elements within the SiPho chip 108 and the fiber connector 112 that have different cross-sectional dimensions.

In another aspect, the photonic engine 103 is configured such that the transmission loss of the optical signal between the first interface 107 and the second interface 109 is approximately or less than 3 dB, inclusive of loss due to the transmission of the optical signal through the plurality of optical structures 110$_1$-110$_N$ themselves. In an embodiment, the transmission loss may largely be dependent on the coupling at the first interface 107 between the SiPho chip 108 and the plurality of optical structures 110$_1$-110$_N$. As shown in FIG. 2B, in an embodiment, the SiPho chip 108 is to be mounted on a coupling surface 208 at a chip mounting region 204 of the PGL substrate 106. When mounted on chip mounting region 204, the plurality of waveguides 108A disposed on the side surface 108B of the SiPho chip 108 are aligned with the plurality of optical structures 110$_1$-110$_N$ found at the first interface 107.

In some embodiments, which can be combined with other embodiments described herein, the PGL substrate 106 further includes one or more fiducial marks 206 to assist in the alignment and mounting of the SiPho chip 108 on the chip mounting region 204. The one or more fiducial marks 206 operate to guide and help align the position of the SiPho chip 108 along the X-Y plane of the PGL substrate 106 to ensure mounting of the SiPho chip 108 occurs with proper alignment to one or more electrical contacts (e.g., vias 1006 (FIG. 10)) and optical structure portions of the PGL substrate 106. As such, in an embodiment, the tolerance for error in the coupling or hybrid bonding the SiPho chip 108 and the plurality of optical structures 110$_1$-110$_N$ together at the first interface 107, which will be discussed further below, may be in a range from 0.1 to 2 microns to ensure the connections are optimized for the lowest signal loss. In one embodiment, the misalignment of the centers of the waveguides 108A and the optical structures 110$_1$-110$_N$ is maintained such that the lateral misalignment in the Y-direction (i.e., top to bottom direction in FIG. 2B) is less than 1 to 2 microns. In some embodiments, the misalignment of the centers of the waveguides 108A and the optical structures 110$_1$-110$_N$ is also maintained such that the vertical misalignment in the Z-direction (FIG. 10 or 11) is less than 1 to 2 microns. In one embodiment, the variability in the vertical misalignment can be dependent on the variability of the compression of a plurality solder balls 1010 or other electrical contact that is used to electrically couple the SiPho chip 108 to a plurality of vias 1006 (FIGS. 10-11) formed in a portion of the PGL substrate 106.

Figure 3A:
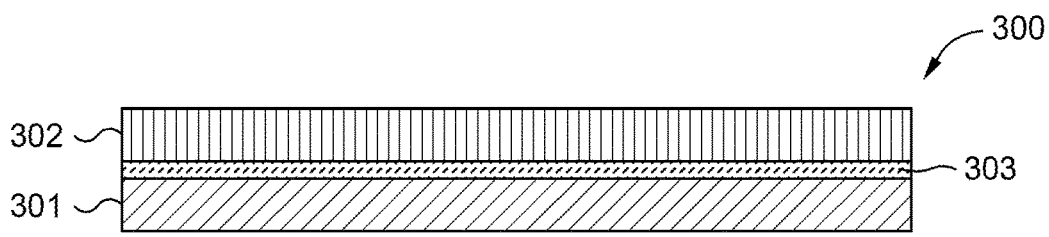
FIGS. 3A-3E are schematic, cross-sectional views of a portion of one or more optical silicon photonic devices, according to an embodiment.
Figure 6:
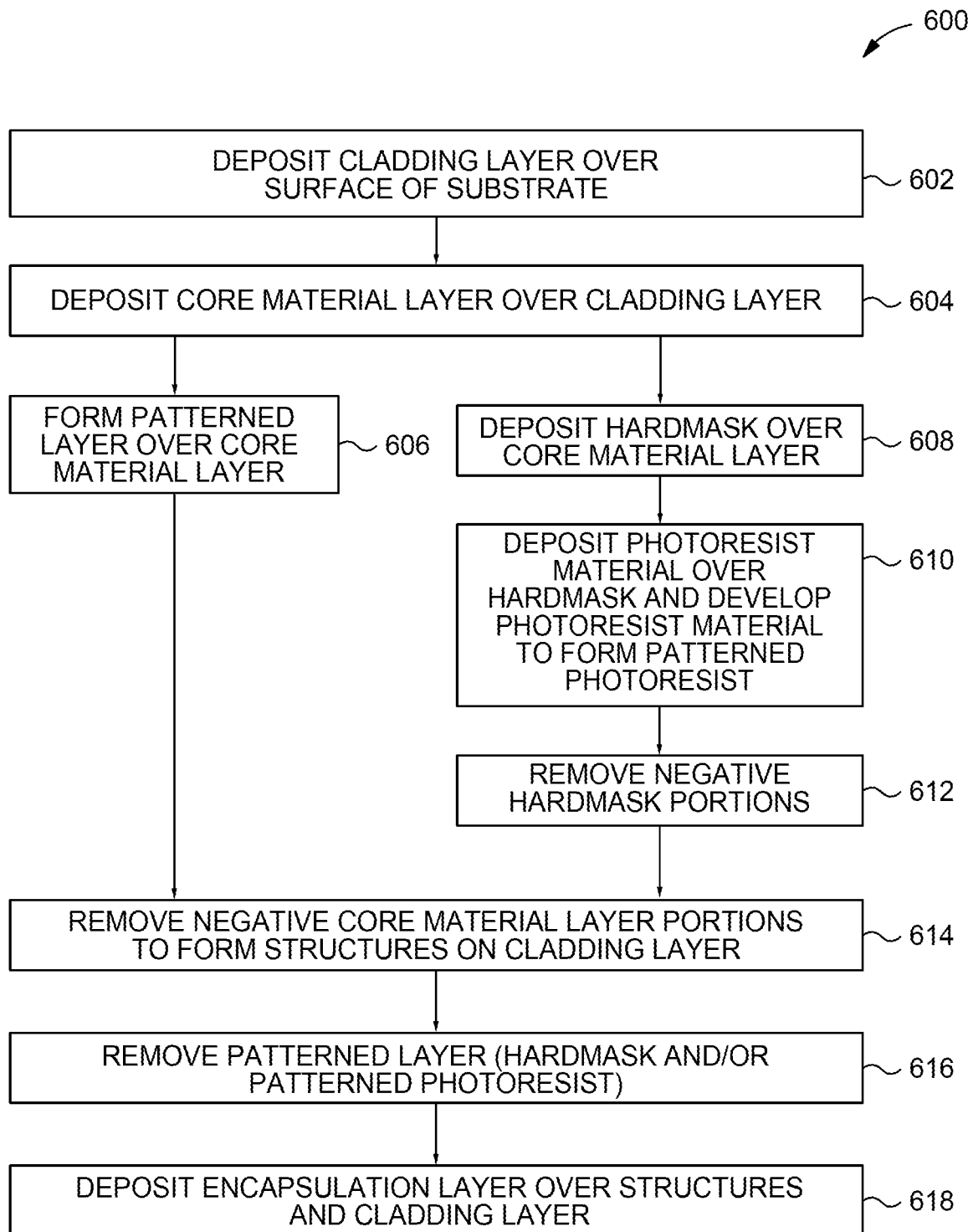
FIG. 6 is a flow diagram illustrating operations of a method for fabricating an optical device on a photonic glass layer substrate, according to an embodiment.

FIG. 6 is a flow diagram illustrating operations of an exemplary method 600 for fabricating a portion 300 of the PGL substrate 106, as shown in FIGS. 3A-3E, such as a portion of the optical structures 110$_1$-110$_N$. The method 600 includes operations 602-618. In one embodiment, the method 600 is a single substrate process or batch process involving a plurality of substrates that are fabricated simultaneously. At operation 602, as shown in FIG. 3A, a cladding layer 303 is disposed over a surface of a supporting substrate 301. The cladding layer 303 may be disposed over the surface using a liquid material pour casting process, a spin-on coating process, a liquid spray coating process, a dry powder coating process, a screen printing process, a doctor blading process, a PVD process, a CVD process, a PECVD process, a FCVD process, an ALD process, or an evaporation process. In one embodiment, the cladding layer 303 is made of a material having a refractive index that is relatively low, as compared to the refractive index of the core material layer 302, which is formed in a subsequent operation. In some embodiments, the cladding layer 303 has a refractive index between 1.3 and 1.5. In some embodiments, the cladding layer 303 employed at operation 601 can be formed from one or more low-index materials including $Si_3N_4$, $SiO_2$, doped $SiO_2$, low-index fluoropolymers, nanoparticle films, hydrogels, porous materials, and photoresist containing materials.

At operation 604, as shown in FIG. 3A, a core material layer 302 is disposed over the surface of cladding layer 303 and the supporting substrate 301. The core material layer 302 may be disposed over the surface of the cladding layer 303 using a liquid material pour casting process, a spin-on coating process, a liquid spray coating process, a dry powder coating process, a screen printing process, a doctor blading process, a PVD process, a CVD process, a PECVD process, a FCVD process, an ALD process, or an evaporation process. In some embodiments, the supporting substrate 301 includes a material selected from a group that consists of silica ($SiO_2$), boron oxide ($B_2O_3$), and alumina ($Al_2O_3$).

The core material layer 302 can be a low index of refraction material or a high index of refraction material, depending upon the embodiment. The material used to form the core material layer 302 has a refractive index different from the refractive index of the material used to form the cladding layer 303. In some embodiments, the core material layer 302 has a refractive index between 1.4 and 1.5. In another embodiment, the material used to form the core material layer 302 has a refractive index that is higher than the refractive index of the material used to form the cladding layer 303. In general, the refractive index of the core material layer 302 is different from the cladding layer 303, and also the encapsulation layer 314 discussed further below. In one example, the core material layer 302 has a refractive index between 1.45 and 1.50 while the cladding layer 303 and encapsulation layer 314 have a refractive index between 1.40 and 1.44.

In an embodiment, which can be combined with other embodiments described herein, the core material layer 302 can be formed from one or more materials including, without limitation, silicon carbide (SiC), silicon oxycarbide (SiOC), titanium dioxide ($TiO_2$), silicon dioxide ($SiO_2$), vanadium (IV) oxide ($VO_x$), aluminum oxide ($Al_2O_3$), aluminum-doped zinc oxide (AZO), indium tin oxide (ITO), tin dioxide ($SnO_2$), zinc oxide (ZnO), tantalum pentoxide ($Ta_2O_5$), silicon nitride ($Si_3N_4$), zirconium dioxide ($ZrO_2$), niobium oxide ($Nb_2O_5$), cadmium stannate ($Cd_2SnO_4$), silicon mononitride (SiN), silicon oxynitride (SiON), barium titanate ($BaTiO_3$), diamond like carbon (DLC), hafnium (IV) oxide ($HfO_2$), lithium niobate ($LiNbO_3$), silicon carbon-nitride (SiCN) containing materials or other material(s) suitable for the formation of optical structures.

At operation 606, a patterned layer 305 is disposed over the core material layer 302. The patterned layer 305 defines exposed negative portions of the core material layer 302 that when removed, correspond to a structure pattern that will enable the formation of the optical structures 110 in a subsequent operation.

Figure 3B:
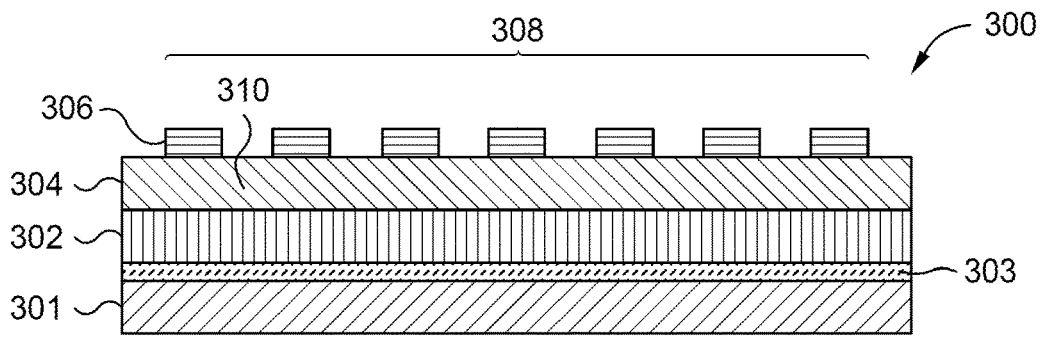
Figure 3C:
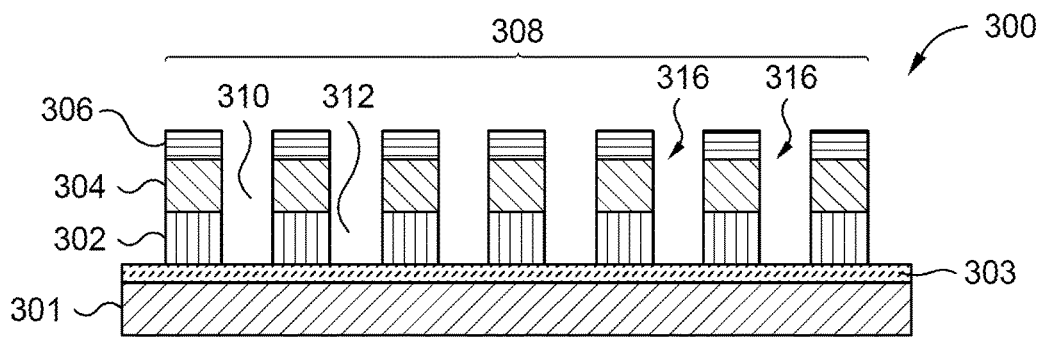
Figure 3D:
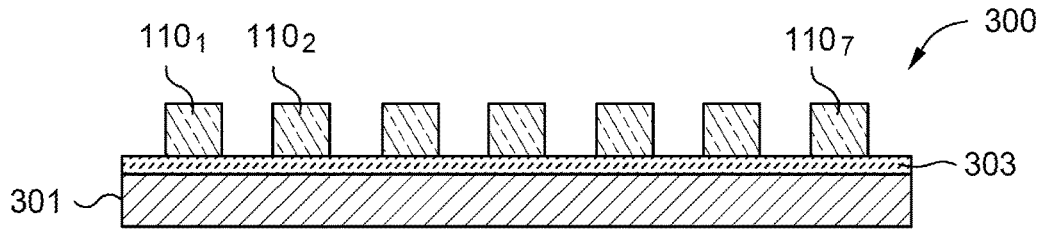

In an embodiment, as shown in FIGS. 3B and 3C and described in further detail below in operations 608-612, disposing the patterned layer 305 on the core material layer 302 may include disposing a hardmask 304 on the core material layer 302, disposing a patterned photoresist 306 on the hardmask 304, the patterned photoresist 306 defining exposed portions of the hardmask 304, and removing the exposed portions of the hardmask 304 to form a patterned hardmask 304 corresponding to the patterned photoresist 306.

In another embodiment, disposing the patterned layer 305 on the core material layer 302 in operation 606 may include forming a patterned photoresist over the core material layer 302 by disposing a photoresist layer on the core material layer 302 and performing a lithography process to pattern and develop the photoresist material. The patterned photoresist defines exposed negative portions of the core material layer 302. The patterned photoresist would allow the selective etching of the core material layer 302 under the patterned photoresist, as the patterned photoresist protects certain regions of the core material layer 302 from unwanted etching in subsequent processes. In such an embodiment, the method 600 continues with operation 614 below to remove negative structure portions 312 of the core material layer 302 defined by the patterned layer 305.

In operation 608, as shown in FIG. 3B, the hardmask 304 is disposed over the core material layer 302. The hardmask 304 may be disposed over the core material layer 302 using a liquid material pour casting process, a spin-on coating process, a liquid spray coating process, a dry powder coating process, a screen printing process, a doctor blading process, a PVD process, a CVD process, a PECVD process, a FCVD process, an ALD process, or an evaporation process. The hardmask 304 can include, but is not limited to, a material selected from a group of chromium (Cr), silver (Ag), $Si_3N_4$, $SiO_2$, TiN, and carbon (C) containing materials.

At operation 610, as shown in FIG. 3B, the patterned photoresist 306 is disposed over the core material layer 302, and, when present, also over the hardmask 304. The patterned photoresist 306 allows the selective etching of material under the patterned photoresist 306, as the patterned photoresist 306 protects certain regions from unwanted etching in subsequent processes. In one example, the patterned photoresist 306 is formed by disposing a photoresist material on the hardmask 304 and performing a lithography process to pattern and develop the photoresist material. The patterned photoresist 306 defines exposed portions 310 of the hardmask 304 (i.e., openings of the hardmask 304). The exposed portions 310 correspond to a pattern 308 that will be used to form the optical structures 110. The patterned photoresist 306 may be disposed on the hardmask 304 or on the core material layer 302 using a spin-on coating process. The photoresist material 306 may include, but is not limited to, light-sensitive polymer containing materials.

At operation 612, as shown in FIG. 3C, the exposed portions 310 of the hardmask 304 are removed. Removing the hardmask portions 310 exposes negative structure portions 312 of the core material layer 302. The negative structure portions 312 correspond to the structure pattern 308 that will enable the formation of the optical structures 110 in a subsequent operation. In one embodiment, the exposed portions 310 are removed by an ion etching, RIE, or selective wet chemical etching process to form a plurality of openings in the hardmask 304.

At operation 614, as shown in FIG. 3C, the negative structure portions 312 of the core material layer 302 are removed to form the plurality of optical structures 110. In one embodiment, which can be combined with other embodiments described herein, the negative structure portions 312 are removed by an ion etching, RIE, or selective wet chemical etching process to form a plurality of trenches 316 in the core material layer 302. In an embodiment, the removal of the exposed portions 310 in operation 612 and the etching of the negative structure portions 312 in operation 614 may be performed simultaneously or sequentially. In one aspect, the hardmask 304 has a lower etch rate than the material of the core material layer 302.

At operation 616, the patterned layer 305 is removed. Removing the patterned layer 305 includes removing a hardmask and/or a photoresist layer. In the example shown in FIG. 3D, removing the patterned layer 305 includes removing the hardmask 304 and the patterned photoresist 306. Removing the hardmask 304 may include ion etching, RIE, or selective wet chemical etching. Removing the patterned photoresist 306 may include the use of an ashing process or etching process described herein.

Figure 3E:
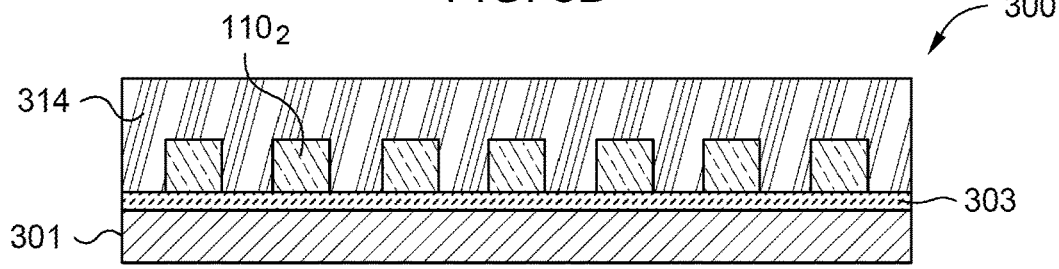

At operation 618, as shown in FIG. 3E, an encapsulation layer is disposed over the cladding layer 303 and the plurality of optical structures 110. The encapsulation layer 314 may be formed by use of one or more of PVD, CVD, FCVD, and spin-on coating processes. In one embodiment, the encapsulation layer 314 is made of a material having a refractive index that is relatively low, as compared to the refractive index of the core material layer 302. In some embodiments, the encapsulation layer 314 has a refractive index between 1.3 and 1.5, such as between 1.40 and 1.44. In some embodiments, more than one encapsulation layer can be used having more than one index of refraction.

In an embodiment, which can be combined with other embodiments herein, the encapsulation layer 314 can be formed from one or more low-index materials including $Si_3N_4$, $SiO_2$, doped $SiO_2$, low-index fluoropolymers, nanoparticle films, hydrogels, porous materials, and photoresist containing materials. The material used to form the encapsulation layer 314 has a refractive index different from the refractive index of the material used to form the core material layer 302. In one embodiment, the material used to form the encapsulation layer 314 has a refractive index lower than the refractive index of the material used to form the core material layer 302. Low-index materials are discussed herein in contrast to "high" index materials such as amorphous and crystalline silicon, silicon nitride, titanium dioxide, gallium phosphide, tantalum pentoxide, gallium nitride, sulfur-inated materials, polymers, and other materials with appropriate optical properties. It is contemplated that materials and combinations of materials can be used to form the cladding layer 303, encapsulation layer 314 and/or the core material layer 302 discussed herein, and that these materials can be selected based on the targeted optical properties of the optical device(s) fabricated in the method 600.

In another embodiment, which can be combined with other embodiments herein, the encapsulation layer 314 can be formed to include an interlayer (not shown) that extends above a top surface of the encapsulation layer 314. The interlayer may be used to separate the encapsulation layer 314 and the optical structures 110 formed from the core material layer 302 from additional optical structures of a second optical structure material layer (not shown). Thus, optical structures of additional different optical layers may be formed and layered on top off the portion 300 shown in FIG. 3E while not being in direct contact with the optical structure 110 or the encapsulation layer 314. Furthermore, the lower the refractive index of the material used for encapsulation, the lower the aspect ratio of the constituent nanostructures (features patterned) for each optical structure. In an embodiment, lower aspect ratio features produce thinner optical layers, as well as faster and cleaner etching. Thus, the systems and methods herein result in more efficient fabrication processes in terms of time, cost, and complexities.

While the optical structures 110 illustrated herein in FIGS. 3A-3E are shown as having approximately square or rectangular-shaped cross-sections, it is contemplated that the optical structures can, in other examples, include tapered sidewalls and thus form a trapezoidal cross-section (not pictured). In one example, the trapezoidal cross-section is wider near the top versus the bottom of the opening.

Therefore, the method 600 can be used to form the optical structures $110_1$-$110_N$, which include the remaining portions of the core material layer 302, by use of a negative pattering process. As illustrated in FIG. 3E, the PGL substrate 106 includes seven optical structures (i.e., optical structures $110_1$-$110_7$) that are disposed on the supporting substrate 301 and are each encapsulated and separated by at least a portion of the encapsulation layer 314.

Figure 7:
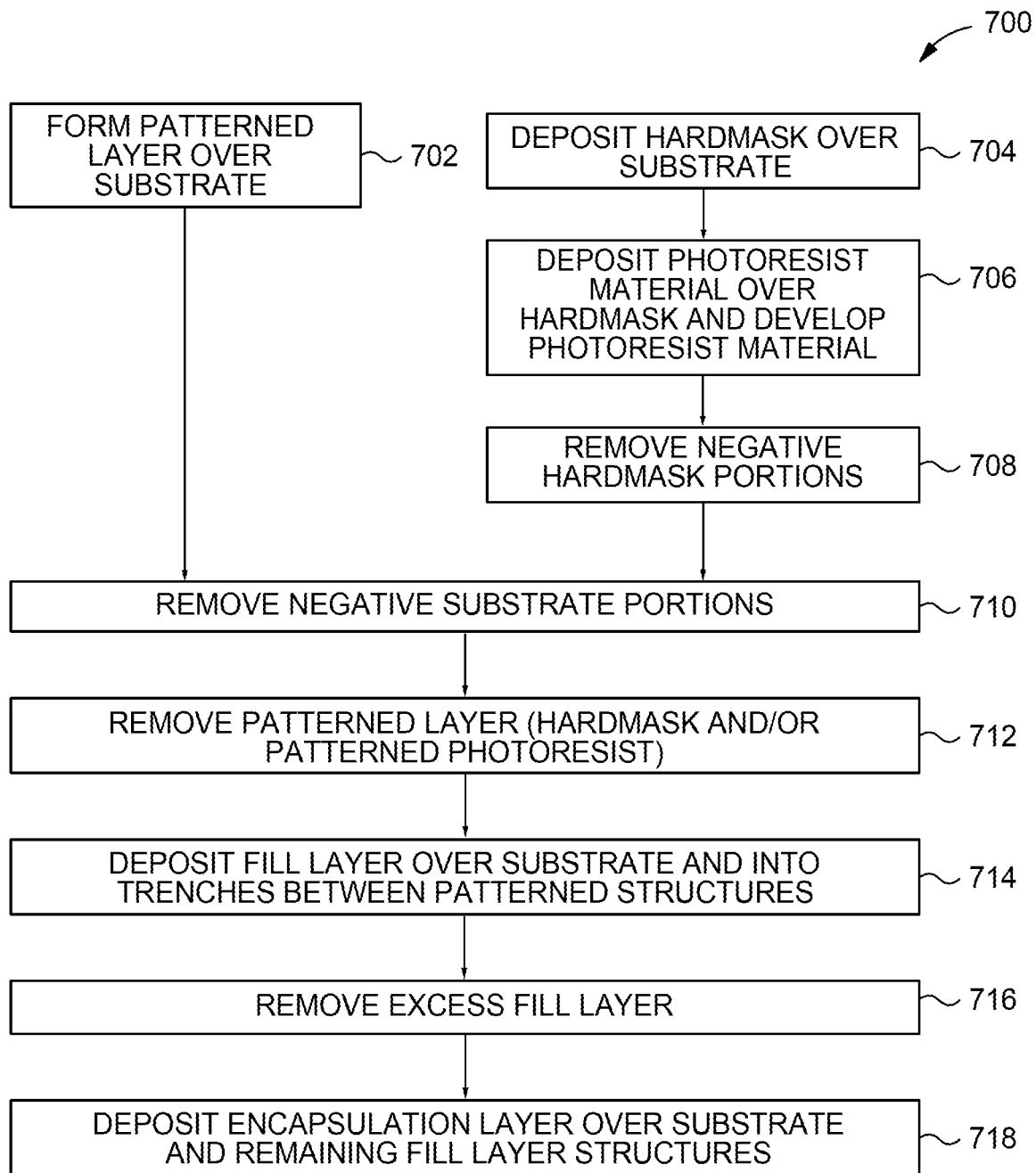
FIG. 7 is a flow diagram illustrating operations of a method for fabricating an optical device on a photonic glass layer substrate, according to an embodiment.

FIG. 7 is a flow diagram illustrating operations of another exemplary method 700 for fabricating a portion 400 of the PGL substrate 106, as shown in FIGS. 4A-4F, such as a portion of the optical structures $110_1$-$110_N$. The method 700 can include operations 702-718. The method 700 begins in operation 702 with a patterned layer 405 disposed over the supporting substrate 401. The patterned layer 405 defines exposed negative portions of the supporting substrate 401 that when removed, correspond to a structure pattern that will enable the formation of the optical structures 110 in a subsequent operation.

Figure 4A:
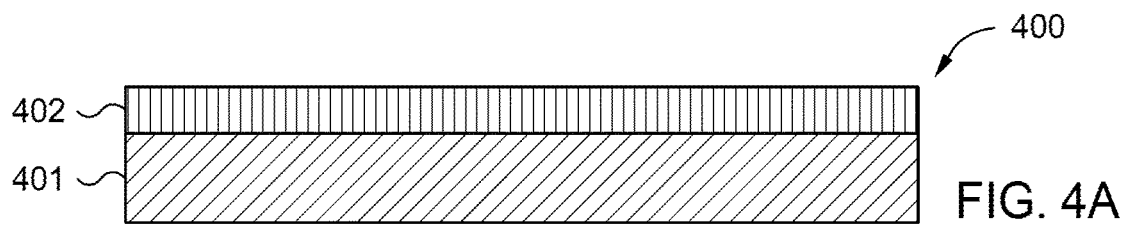
FIGS. 4A-4G are schematic, cross-sectional views of a portion of one or more optical silicon photonic devices, according to an embodiment.
Figure 4B:
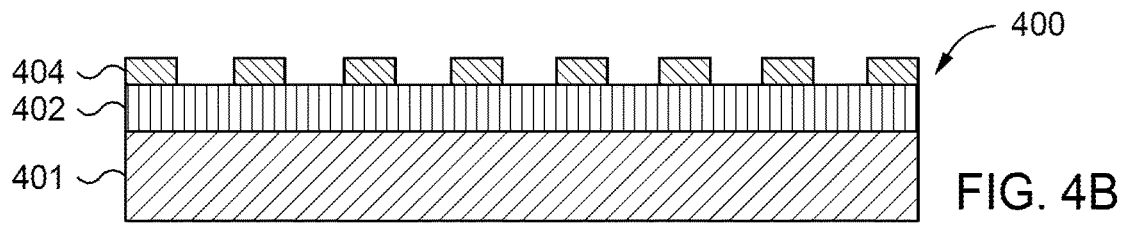
Figure 4C:
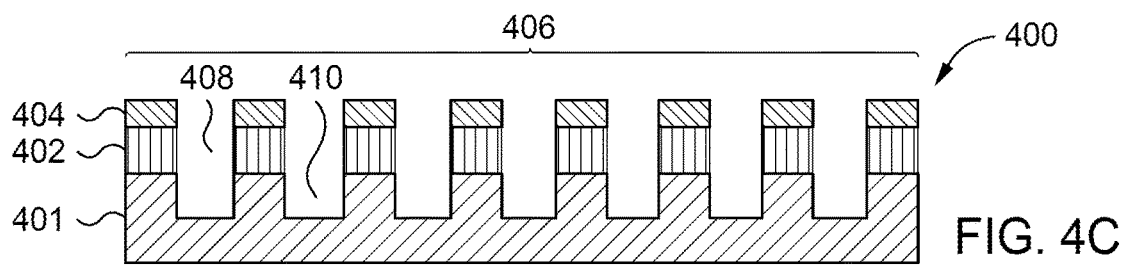
Figure 4D:
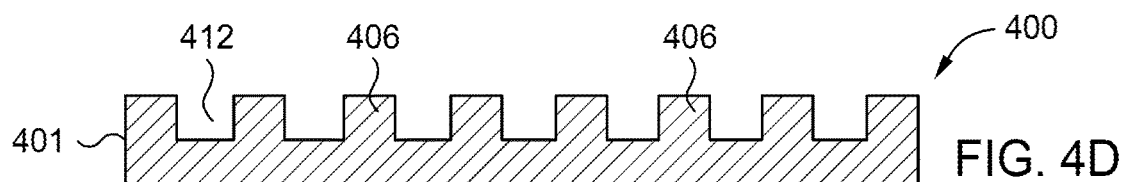

In an embodiment, as shown in FIGS. 4B and 4C and described in further detail below in operations 704-708, disposing the patterned layer 405 on the supporting substrate 401 may include disposing a hardmask 402 on the supporting substrate 401, disposing a patterned photoresist 404 on the hardmask 402, the patterned photoresist 404 defining exposed portions of the hardmask 402, and removing the exposed portions of the hardmask 402 to form a patterned hardmask 402 corresponding to the patterned photoresist 404.

In another embodiment, disposing the patterned layer 405 on the supporting substrate 401 in operation 702 may include either directly disposing a patterned photoresist over the supporting substrate 401 or disposing a photoresist layer on the supporting substrate 401 and performing a lithography process to pattern and develop the photoresist material. The patterned photoresist defines exposed negative portions of the supporting substrate 401. The patterned photoresist would allow the selective etching of the supporting substrate 401 under the patterned photoresist, as the patterned photoresist protects certain regions of the supporting substrate 401 from unwanted etching in subsequent processes. In such an embodiment, the method 600 continues with operation 710 below to remove negative structure portions 410 of the supporting substrate 401 defined by the patterned layer 405.

At operation 704, as shown in FIG. 4A, the hardmask 402 is disposed over the supporting substrate 401. The hardmask 402 may be disposed over the supporting substrate 401 using a liquid material pour casting process, a spin-on coating process, a liquid spray coating process, a dry powder coating process, a screen printing process, a doctor blading process, a PVD process, a CVD process, a PECVD process, a FCVD process, an ALD process, or an evaporation process. The hardmask 304 can include, but is not limited to, a material selected from a group of chromium (Cr), silver (Ag), $Si_3N_4$, $SiO_2$, TiN, and carbon (C) containing materials. In some embodiments, the supporting substrate 401 includes a material selected from a group that consists of silica ($SiO_2$), boron oxide ($B_2O_3$), and alumina ($Al_2O_3$).

At operation 706, the patterned photoresist 404 is disposed over the supporting substrate 401, and, when present, also over the hardmask 402, as shown in FIG. 4B. The patterned photoresist 404 allows the selective etching of material under the patterned photoresist 404, as the patterned photoresist 404 protects certain regions from unwanted etching in subsequent processes. In one example, the patterned photoresist 404 is formed by disposing a photoresist material on the hardmask 402 and performing a lithography process to pattern and develop the photoresist material. The patterned photoresist 404 defines exposed portions 408 of the hardmask 402 (i.e., openings of the hardmask 402). The exposed portions 408 correspond to a structure pattern 406 to result in the formation of the plurality of optical structures 110. In one example, the patterned photoresist 404 may be disposed on the hardmask 402 using a spin-on coating process. The photoresist material 404 may include, but is not limited to, light-sensitive polymer containing materials.

At operation 708, as shown in FIG. 4C, the exposed portions 408 of the hardmask 402 are removed. Removing the exposed portions 408 exposes negative structure portions 410 of the supporting substrate 401. The negative structure portions 410 correspond to the structure pattern 406 to result in the formation of the optical structures 110. In one embodiment, the exposed portions 408 are removed by an ion etching, RIE, or selective wet chemical etching process to form a plurality of openings in the hardmask 402.

At operation 710, as shown in FIG. 4C, the negative structure portions 410 of the supporting substrate 401 are removed to form the patterned structures 406. In an embodiment, which can be combined with other embodiments described herein, the negative structure portions 410 of the supporting substrate 401 may be removed by an ion etching, RIE, or selective wet chemical etching process to form a plurality of trenches 412 in the supporting substrate 401. In an embodiment, the removal of the exposed portions 408 in operation 708 and portions of the supporting substrate 401 in operation 712 may be performed simultaneously or sequentially. In one aspect, the hardmask 402 has a lower etch rate than the material of the supporting substrate 401.

At operation 712, the patterned layer 405 is removed. Removing the patterned layer 405 may include removing a hardmask and/or a photoresist layer. In the example shown in FIG. 4D, removing the patterned layer 405 includes removing the hardmask 402 and the patterned photoresist 404, thereby leaving the supporting substrate 401 with the plurality of patterned structures 406 each separated by the plurality of trenches 412. In an embodiment, removing the hardmask 402 may include ion etching, RIE, or selective wet chemical etching. Removing the patterned photoresist 404 may include a conventional ashing process or etching process.

Figure 4E:
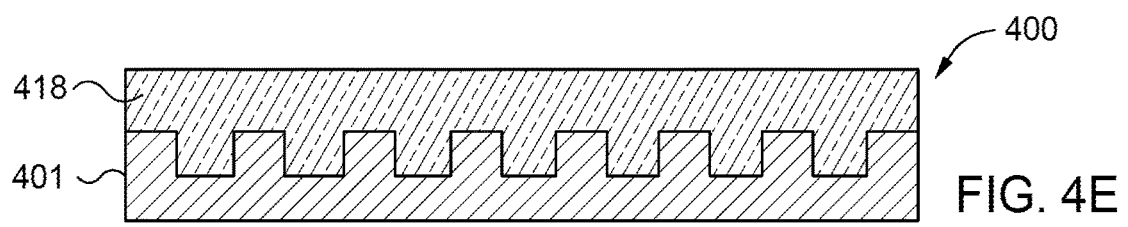

At operation 714, as shown in FIG. 4E, a fill layer 418 is disposed over the supporting substrate 401 and the patterned structures 406 formed therein. The fill layer 418 can include, but is not limited to, a material selected from a group of $Si_3N_4$, $SiO_2$, low-index fluoropolymers, hydrogels, and photoresist containing materials. The fill layer 418 may be disposed over the supporting substrate 401 and into the plurality of trenches 412 by one or more of PVD, CVD, FCVD, and spin-on coating processes. The flowable nature of the fill layer 418 allows for the fill layer 418 to also flow into each of the plurality of trenches 412.

In one embodiment, the fill layer 418 is formed from material having a refractive index different from the refractive index of the PGL substrate 106 in the supporting substrate 401. In some embodiments, the fill layer 418 has a refractive index between 1.4 and 1.5. In another embodiment, the fill layer 418 is formed from material having a refractive index greater than the refractive index of the supporting substrate 401. In certain embodiment, the fill layer 418 may formed from a high-index material such as amorphous and crystalline silicon, silicon nitride, titanium dioxide, gallium phosphide, tantalum pentoxide, gallium nitride, sulfur-inated materials, polymers, and other materials with appropriate optical properties. It is contemplated that materials and combinations of materials can be used to form the fill layer 418 discussed herein, and that these materials can be selected based on the targeted optical properties of the optical device(s) fabricated in the method 700. In one example, the fill layer 418 has a refractive index between 1.45 and 1.50 while the supporting substrate 401 has a smaller refractive index between 1.40 and 1.44.

Figure 4F:
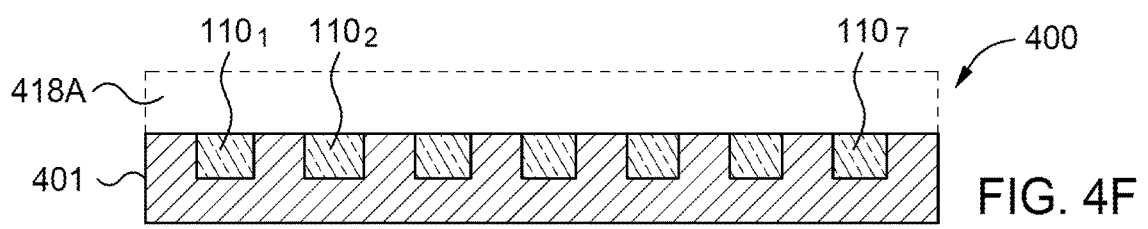

At operation 716, as shown in FIG. 4F, an excess fill layer portion 418A is removed, such that the height of the fill layer 418 within the plurality of trenches 412 is approximately the same height as the patterned structures 406 of the supporting substrate 401. The excess filler layer 418A may be removed using a chemical mechanical polishing (CMP) process, according to one embodiment. The removal of the excess fill layer 418 forms the plurality of optical structure 110 in the substrate 401 separated by the patterned structures 406.

While the optical structures 110 illustrated herein in FIGS. 4A-4F are shown as having approximately square or rectangular-shaped cross-sections, it is contemplated that the optical structures can, in other examples, include tapered sidewalls and thus form a trapezoidal cross-section (not pictured). In one example, the trapezoidal cross-section is wider near the top versus the bottom of the opening.

Figure 4G:
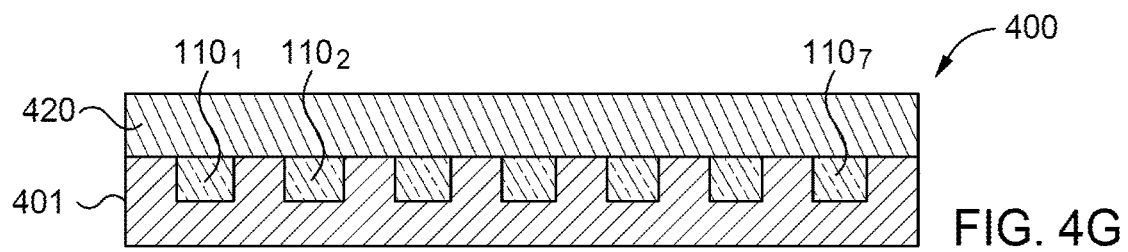

At operation 718, as shown in FIG. 4G, an encapsulation layer 420 is optionally disposed over the supporting substrate 401 and the plurality of optical structures 110. The encapsulation layer 420 may be formed by use of one or more of PVD, CVD, FCVD, and spin-on coating processes. In one embodiment, the encapsulation layer 420 is made of low-index of refraction material, as compared to the refractive index of the fill layer 418. In some embodiments, the encapsulation layer 420 has a refractive index between 1.3 and 1.9, such as between 1.40 and 1.44.

Therefore, the method 700 can be used to form the optical structures $110_1$-$110_N$, which include the remaining portions of the fill layer 418, by use of a negative pattering process. As illustrated in FIGS. 4F and 4G, the PGL substrate 106 includes seven optical structures (i.e., optical structures $110_1$-$110_7$) that include the portions of the fill layer 418 that are disposed within the supporting substrate 401, and thus are separated by portions of the supporting substrate 401.

Figure 8:
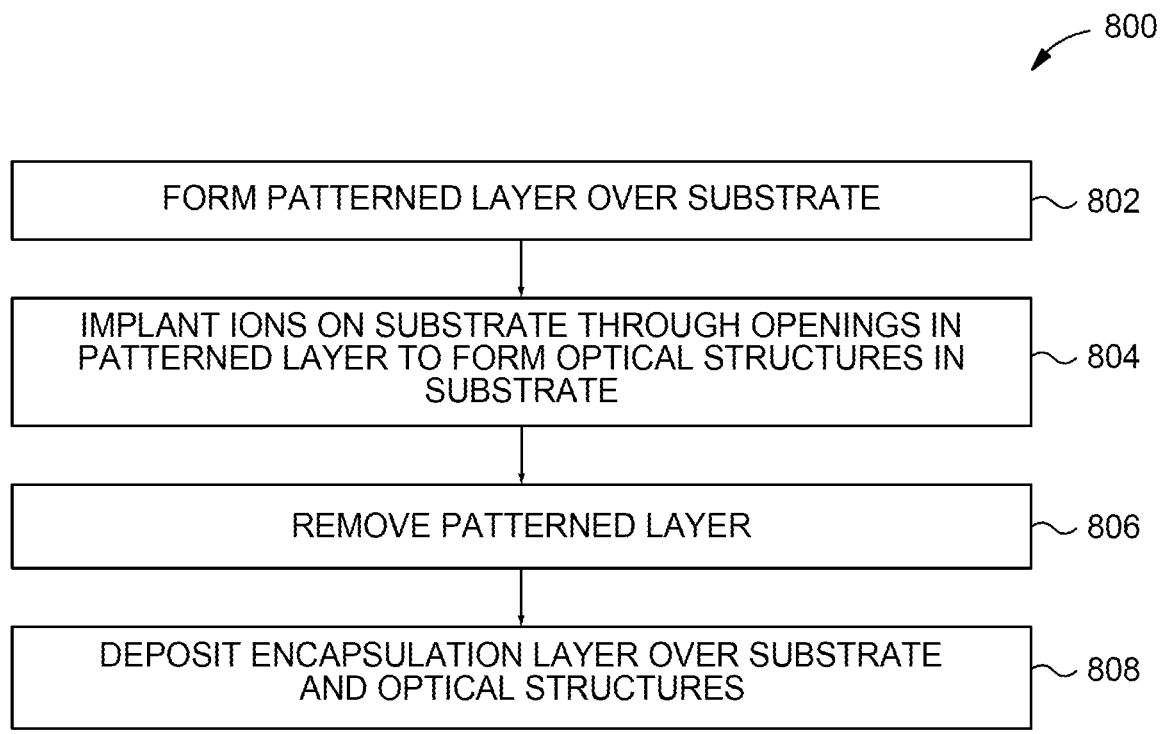
FIG. 8 is a flow diagram illustrating operations of a method for fabricating an optical device on a photonic glass layer substrate, according to an embodiment.

FIG. 8 is a flow diagram illustrating operations of an exemplary method 800 for fabricating a portion 500 of the PGL substrate 106, as shown in FIGS. 5A-5E, such as a portion of the optical structures $110_1$-$110_N$. The method 800 includes operations 802-808. Method 800 provides for depositing species of a refractive index changing material into a portion of a supporting substrate 501 via an ion implantation process. Ion implantation is a surface modification technique capable of modifying the optical properties of a portion of a surface layer of the supporting substrate 501. Ion implantation allows accurate control of both dopant composition and penetration depth through the choice of the species and the energy of the doping ions. In some embodiments, the supporting substrate 501 includes a material selected from a group that consists of silica ($SiO_2$), boron oxide ($B_2O_3$), and alumina ($Al_2O_3$).

Figure 5A:
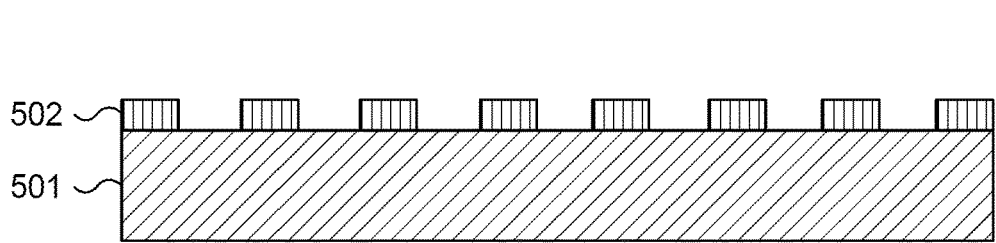
FIGS. 5A-5E are schematic, cross-sectional views of a portion of one or more optical silicon photonic devices, according to an embodiment.

At operation 802, as shown in FIG. 5A, a patterned layer 502 is disposed over the supporting substrate 501. The patterned layer 502 defines exposed substrate portions 504 of the supporting substrate 501 (i.e., openings of the patterned layer 502). The patterned layer 502 is configured to allow the selective implantation of doping ions into the supporting substrate 501 disposed under the patterned layer 502, as portions of the patterned layer 502 are able to function as a mask to block the doping ions from reaching selected portions of the supporting substrate 501 under the patterned layer 502.

The patterned layer 502 can be a patterned photoresist or a patterned hardmask. In an embodiment, the patterned layer 502 may be a patterned photoresist formed from materials including, without limitation, such as polymeric materials formed from phenol-, epoxy- or acrylic-resins. The patterned photoresist must be thick enough to reliably absorb the ions at these sites. Accordingly, it will generally be necessary for the resist film thickness to be appropriately selected as the ion energy of the implant process is adjusted. In one example, the patterned layer 502 may be formed by disposing a photoresist material on the substrate 501 and performing a lithography process to pattern and develop the photoresist material. In another embodiment, the patterned layer 502 may be a patterned hardmask. The hardmask can include, but is not limited to, a material selected from a group of chromium (Cr), silver (Ag), $Si_3N_4$, $SiO_2$, TiN, and carbon (C) containing materials.

Figure 5B:
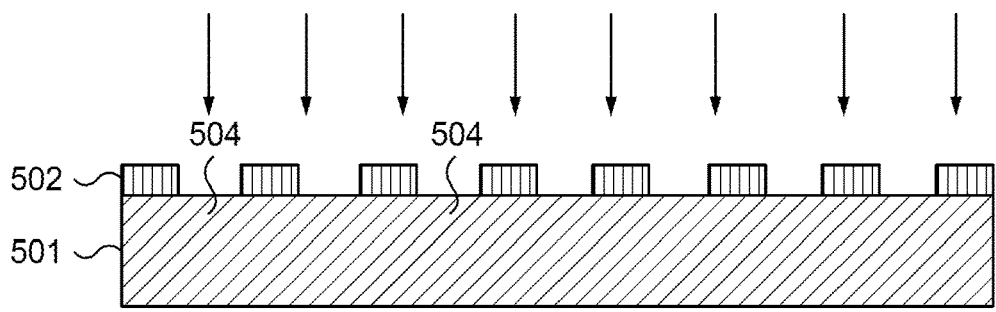

At operation 804, as shown in FIG. 5B, an ion implantation process is performed on the supporting substrate 501. In the ion implantation process, doping ions are accelerated and implanted within the supporting substrate 501 through the openings in the patterned layer 502. The doping ions will include a dopant material that will alter the refractive index of the implanted regions positioned within the openings in the patterned layer 502, and may include at least one of Al, P, F, Cl, P, or gases N, Ar or Kr. As described herein, the doping ions provided in the ion implantation process are generated from a plasma formed by applying a high voltage RF to a processing region of a plasma processing chamber. The plasma dissociated ions are then biased toward the surface of substrate 106 and implanted a certain desired depth from the substrate surface. Once implanted, the doping ions bond with portions of the material in the supporting substrate 501 and induce refractive index modifications in these portions of the PGL substrate 106. In one embodiment, when performing the ion implantation process within method 800, the supporting substrate 501 is placed on a substrate supporting pedestal of a plasma processing chamber, a gas is flowed into the interior of the plasma processing chamber and ignited to generate a plasma. A bias is then applied to the supporting substrate 501 to accelerate the doping ions generated in the plasma towards a surface of the supporting substrate 501. As a result of the plasma and the biasing of the supporting substrate 501, the doping ions generated in the plasma are implanted into the supporting substrate 501 to form a portion of the supporting substrate 501. One example of the ion implantation apparatus is the Varian VIISTA® Trident, available from Applied Materials, Inc., Santa Clara, Calif.

Figure 5C:
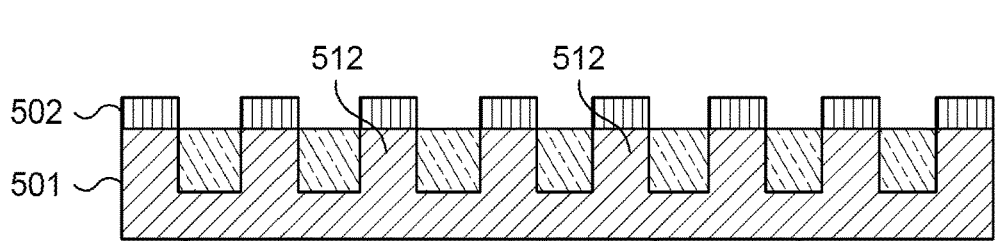
Figure 5D:
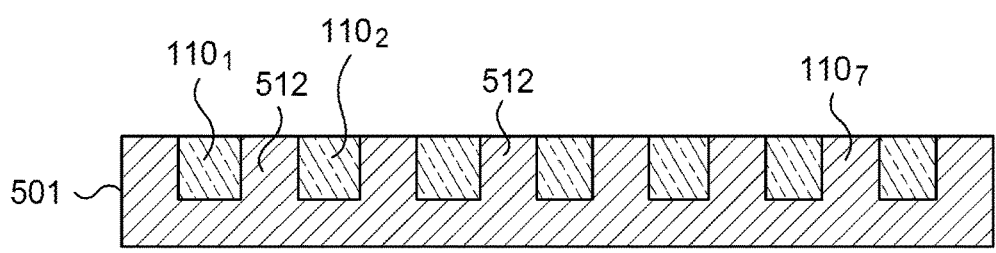

In an embodiment, as shown in FIG. 5C, the ion implantation process employed in operation 804 modifies the exposed substrate portions 504 of the supporting substrate 501 to form the plurality of optical structures 110. On the other hand, substrate regions 512 protected by the patterned layer 502 are not modified by the ion implantation process. In one aspect, the modification by the ion implantation depends on the ions (light ions or heavy ions) implanted in the PGL substrate 106. The ions implanted in the exposed portions 504 of the PGL substrate 106 may be modified to have an increase in refractive index or decrease in refractive index. In one embodiment, the optical structures 110 formed from the ion implantation process comprise a refractive index higher than the refractive index of the PGL supporting substrate 501 and protected regions 512.

Figure 5E:
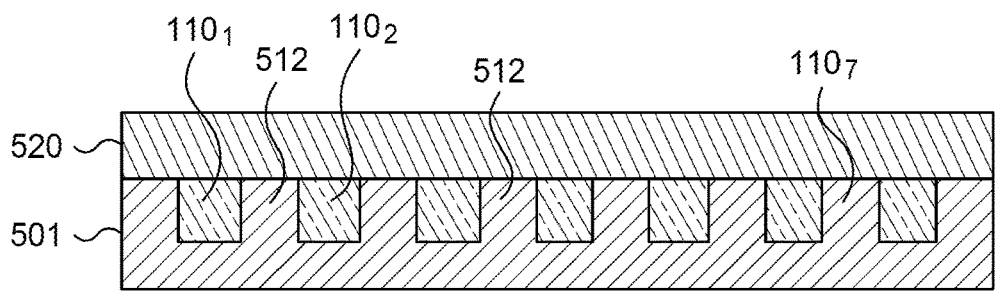

At operation 806, as shown in FIG. 5E, the patterned layer 502 is removed thereby forming a substrate 106 that includes the supporting substrate 501 that has alternating optical structures 110 and substrate regions 512 formed therein. Removing the patterned layer 502 may include removing a patterned hardmask or a patterned photoresist. Removing the patterned hardmask may include ion etching, RIE, or selective wet chemical etching. Removing the patterned photoresist may include the use of an ashing process or etching process described herein.

In some embodiments, it may be desirable to perform an annealing process on the PGL substrate of substrate 501 to activate dopant species and to remove any damage created in the optical structures 110 by the implantation process and/or better distribute the index of refraction altering dopant materials implanted during operation 804 of the method 800.

While the optical structures 110 illustrated herein in FIGS. 5A-5E are shown as having approximately square or rectangular-shaped cross-sections, it is contemplated that the optical structures can, in other examples, include tapered sidewalls and thus form a trapezoidal cross-section (not pictured). In one example, the trapezoidal cross-section is wider near the top versus the bottom of the opening.

At operation 808, as shown in FIG. 5E, an encapsulation layer 520 is optionally disposed over the substrate 501 and the plurality of optical structures 110. The encapsulation layer 520 may be formed by use of one or more of PVD, CVD, FCVD, and spin-on coating processes. In one embodiment, the encapsulation layer 520 is made of low-index of refraction material having a refractive index lower than the refractive index of the implanted portions of the supporting substrate 501. In some embodiments, the encapsulation layer 520 has a refractive index between 1.3 and 1.9, such as between 1.40 and 1.44.

Therefore, the method 800 can be used to form the optical structures $110_1$-$110_N$, which include the implanted portions of the supporting substrate 501, by use of a negative patterning and implantation process. As illustrated in FIG. 5E, the PGL substrate 106 includes seven optical structures (i.e., optical structures $110_1$-$110_7$) that comprise the exposed portions 504 that are formed within the supporting substrate 401.

Figure 9:
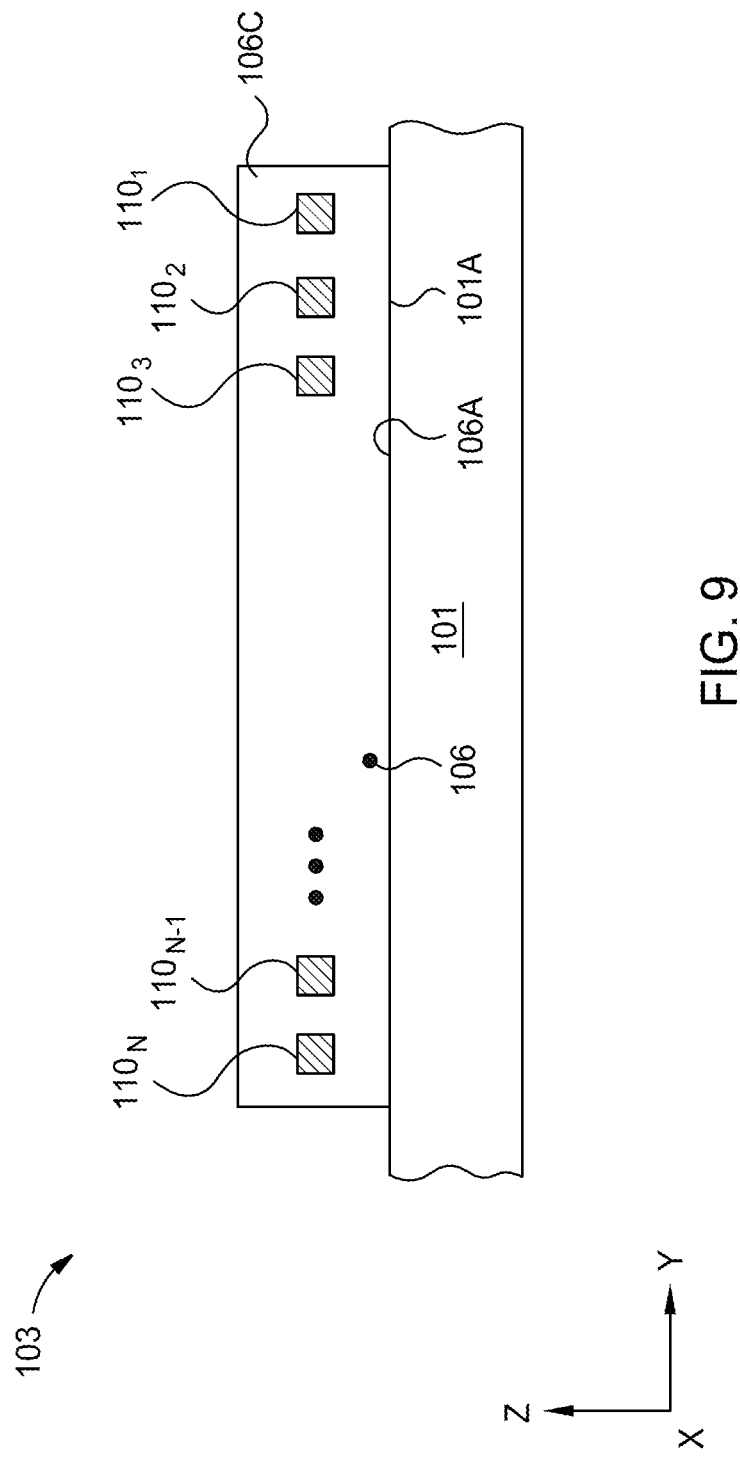
FIG. 9 is a schematic, cross-sectional view of a portion of the photonic engine formed by use of the section line C-C in FIG. 10, according to an embodiment.
Figure 10:
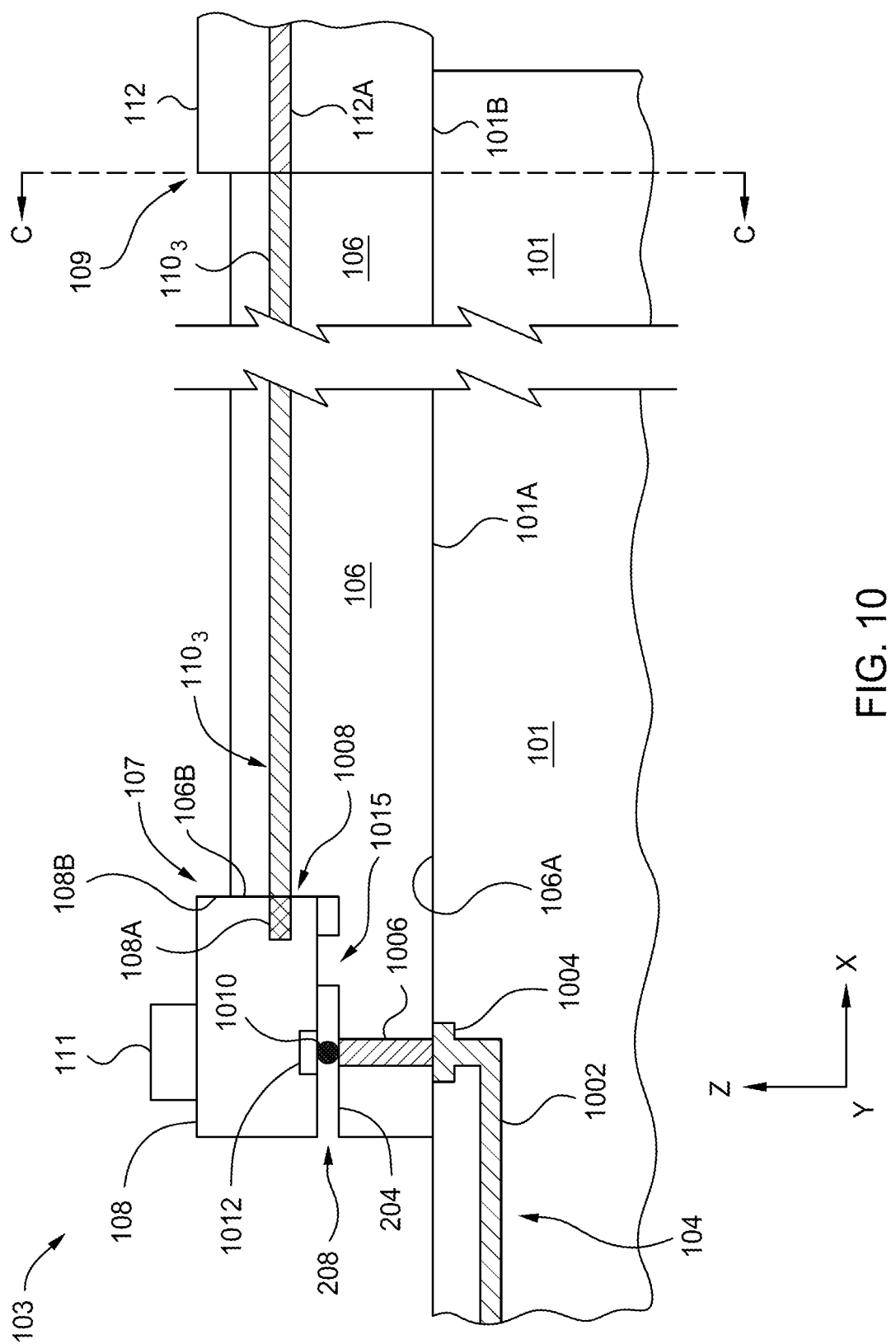
FIG. 10 is a schematic, cross-sectional view of a portion of the photonic engine formed by use of the section line B-B in FIG. 2A, according to an embodiment.

FIG. 9 is a schematic, cross-sectional end view of a portion of the photonic engine 103 mounted on the package substrate 101 formed by use of the sectioning line C-C in FIG. 10, according to an embodiment. As shown in FIG. 9, the photonic engine 103 includes a bottom surface 106A of the photonic glass layer substrate 106 disposed on a top surface 101A of the package substrate 101, with the plurality of optical structures $110_1$-$110_N$ extending through the PGL substrate 106. In the embodiment shown, the plurality of optical structures $110_1$-$110_N$ extending through the PGL substrate 106 are each aligned in the X-Z plane of the PGL substrate 106. While FIG. 9 shows the plurality of optical structures $110_1$-$110_N$ formed in a single row in plane across the PGL substrate 106, other arrangements of the plurality of optical structures $110_1$-$110_N$ may be formed in the PGL substrate 106. For example, more than a single row of optical structures may be formed and stacked vertically. Stacked rows of optical structures may be formed by one or more of the processes described herein, such as the methods described in relation to FIGS. 3A-8. The arrangements of the plurality of optical structures $110_1$-$110_N$ is not intended to limit the scope of the disclosure provided herein.

FIG. 10 is a schematic, transverse cross-sectional lateral view of a portion of the photonic engine 103 mounted on the package substrate 101 that is formed by use of the sectioning line B-B in FIG. 2A, according to an embodiment. As shown, the package substrate 101 includes a plurality of circuit traces 1002 extending from a plurality of corresponding interconnect pads 1004 formed integral in the top surface 101A of package substrate 101. In an embodiment, the plurality of circuit traces 1002 form the interconnects 104 that electrically connect the photonic engine 103 in contact with the plurality of interconnect pads 1004 to the electrical or opto-electrical chip 102. Alternatively, the plurality of circuit traces 1002 may electrically connect the photonic engine 103 in contact with the plurality of interconnect pads 1004 to other integrated circuits disposed on the package substrate 101.

In some embodiments, the plurality of vias 1006 extend through a portion of the PGL substrate 106 between the coupling surface 208 and the bottom surface 106A of the PGL substrate 106. When the photonic engine 103 is mounted to the package substrate 101, in an embodiment, the plurality of vias 1006 are aligned with and placed in electrical contact with the corresponding interconnect pads 1004 that are exposed on the top surface 101A of package substrate 101 and are in electrical connection with the photonic engine 103 through the plurality of circuit traces 1002 formed in the package substrate 101. In another embodiment, the plurality of vias 1006 may alternatively connect the photonic engine 103 to one or more other integrated circuits (chips) embedded in the package substrate 101 or on the package substrate 101.

As shown in FIG. 10, the SiPho chip 108 can be actively or passively mounted on the coupling surface 208 of the PGL substrate 106 with the side surface 108B of the SiPho chip 108 are "butt-coupled" to an end surface 106B of the PGL substrate 106 at the first interface 107. When the SiPho chip 108 is butt-coupled to the end surface 106B of the PGL substrate 106, the end of the waveguide 108A in the SiPho chip 108 is also butt-coupled to a corresponding end of the optical structure 110, such as optical structure 1103, formed in the PGL substrate 106 at a fourth coupling interface 1008. The coupling of the plurality of waveguides 108A to the plurality of optical structures 110 at the fourth interface 1008 can impact the loss of optical signals between the SiPho chip 108 and the PGL substrate 106. As such, to minimize coupling loss, the aforementioned one or more fiducial marks 206 (FIG. 2B) are used during mounting of the SiPho chip 108 to assist in alignment and the precise placement of the SiPho chip 108 to optimize the butt-coupling of the plurality of waveguides 108A and the plurality of optical structures $110_1$-$110_N$ at the fourth interface 1008 and minimize coupling loss.

To connect the SiPho chip 108 to the PGL substrate 106, SiPho chip 108 further include a plurality of solder connects 1012 that are in contact with the plurality of solder balls 1010, wherein the plurality of solder balls 1010 are positioned between the plurality of solder connects 1012 and an end of each of the plurality of vias 1006 on the coupling surface 208. The plurality of solder balls 1010 electrically connect the SiPho chip 108 to the plurality of vias 1006 formed in the photonic glass layer substrate 106. In an embodiment, the plurality of solder balls or other interconnect bumps, pillars or interconnect materials, including planar hybrid bonding techniques, 1010 may be used to connect the plurality of solder connects 1012 to the plurality of vias 1006 extending through the PGL substrate 106 to the substrate 101. In the embodiment shown, the plurality of solder balls 1010 and the plurality of vias 1006 connect the plurality of solder connects 1012 to the plurality of interconnect pads 1004 in the substrate 101, thereby electrically connecting the SiPho chip 108 to the plurality of circuit traces 1002 in the package substrate 101 connected to the plurality of interconnect pads 1004.

In an embodiment, the coupling surface 208 of the PGL substrate 106 may further comprise a plurality of recesses (not shown) for cradling each of the plurality of solder balls 1010 used to connect the plurality of solder connects 1012 in the SiPho chip 108 and the plurality of vias 1006 in the PGL substrate 106. The plurality of recesses may be formed to allow for expansion of the plurality of solder balls 1010 when flattened such that the contacting surface of the plurality of solder balls 1010 may be substantially flush with the coupling surface 208. The flattening of the plurality of solder balls 1010 on the coupling surface 208 when contacting the solder connects 1012 in the SiPho chip 108 assists in ensuring uniformity in the mounting of the SiPho chip 108 on the PGL substrate 106 as well as increases contact reliability of the solder balls 1010.

FIG. 10 also includes a cross-sectional view of a portion of the fiber connector 112 that is coupled to a portion of the PGL substrate 106 at the interface 109, according to an embodiment. In configuration, the fiber connector 112 can be removably connected to a portion of the photonic engine 103 to allow the transmission to and receipt of optical signals from the optical structures 110 by use of a "butt-coupled" connection configuration.

Figure 11:
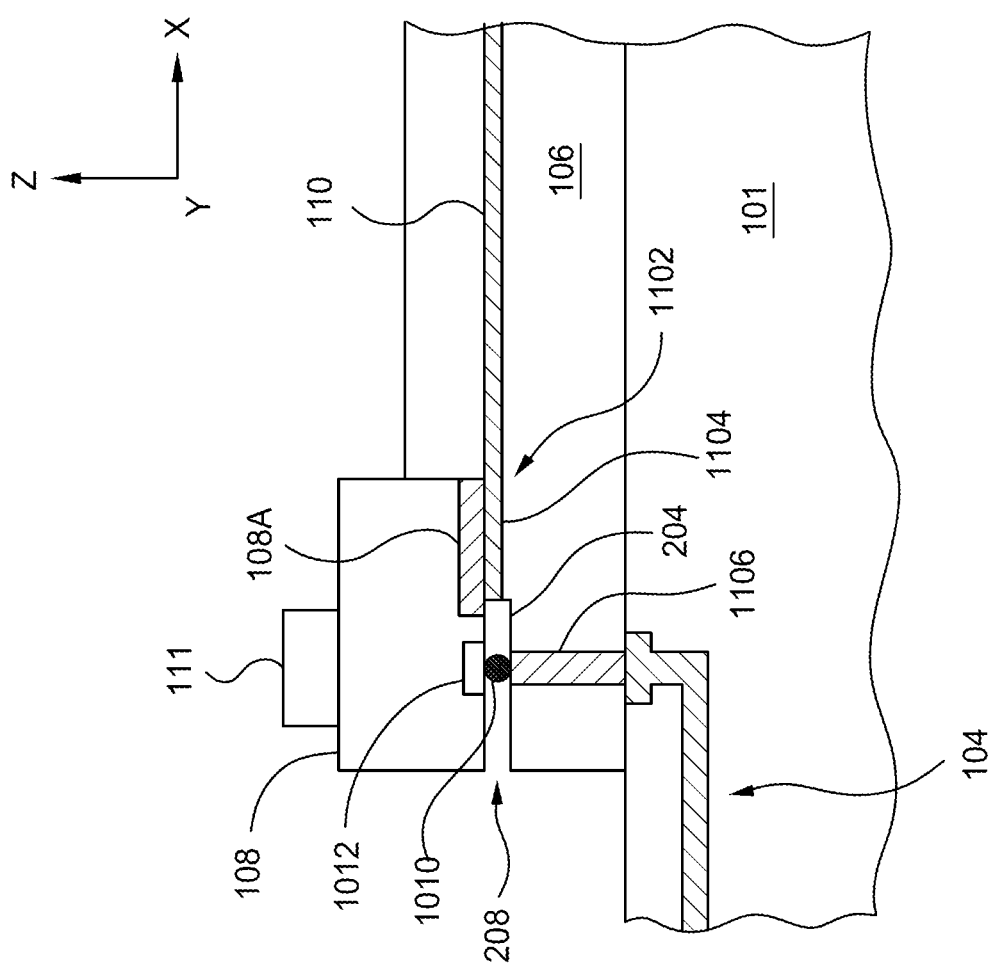
FIG. 11 is a schematic, alternate cross-sectional view of a portion of the photonic engine formed by use of the section line B-B in FIG. 2A, according to an embodiment.

FIG. 11 is a schematic, cross-sectional lateral view of a portion of the photonic engine 103 mounted on the package substrate 101, according to an alternative embodiment. In the embodiment shown, the SiPho chip 108 may be passively mounted on the photonic glass layer substrate 106 in a second chip mounting region 1106 of the photonic glass layer substrate 106. The second chip mounting region 1106 of the PGL substrate 106 further includes a coupling portion 1102 of each of the plurality of optical structures $110_1$-$110_N$ extending along a coupling surface 1104 of the PGL substrate 106. When the SiPho chip 108 is mounted on the second chip mounting region 1106, a portion of the plurality of waveguides 108A in the SiPho chip 108 are evanescently coupled with a surface of the corresponding coupling portions 1102 of each of the plurality of optical structures $110_1$-$110_N$ in the PGL substrate 106. Evanescent coupling is accomplished when two optical waveguides are positioned close together such that the evanescent field generated by one waveguide reaches the other waveguide before any substantial decay of the evanescent field is experienced. The evanescent coupling of the plurality of waveguides 108A to the plurality of optical structures 110 allow for optical signals to be transferred between the coupled waveguides.

In an embodiment, the evanescently coupling of the waveguides may be formed as a directional coupler wherein the evanescent modes of one waveguide overlap with the modes of a second waveguide. When the evanescent modes of the waveguides overlap, evanescent fields generated by the respective waveguides also overlap such that the evanescent field generated by one guide may excite a wave in the other guide. As such, in one aspect, the coupling strength between the plurality of waveguides 108A and the plurality of optical structures 110 may therefore be sensitive to the distance between the waveguides 108A and optical structures 110, and/or the length of the coupling portion 901. The coupling portion 901 and respective contacting portion of the waveguides 108A may therefore be sized and formed to optimize the coupling and minimize coupling loss.

The mounting of the SiPho chip 108 on the substrate 106 in the chip mounting region 1106 of the substrate 106 further includes connecting the plurality of solder connects 1012 in the SiPho chip 108 to the plurality of vias 1006 in the PGL substrate 106 using the plurality of solder balls 1010. The plurality of solder balls 1010 may be positioned on the coupling surface 208 adjacent to the coupling portions 1102 of the plurality of optical structures $110_1$-$110_N$ and aligned between each respective solder connects 1012 and via 1006. The plurality of solder balls 1010 may be sized such that when the plurality of solder balls 1010 is flattened due to the contact of the SiPho chip 108 being mounted on the PGL substrate 106, the plurality of solder balls 1010 is flattened to a height substantially the same as the height of the coupling portions 1102 of the plurality of optical structures $110_1$-$110_N$. In the embodiment shown, the plurality of solder balls 1010 in contact with the plurality of vias 1006 and the plurality of interconnect pads 1004 electrically connect the SiPho chip 108 to the plurality of circuit traces 1002 in the package substrate 101. Further, one or more stand-off structures 1015 can be used to position, support and/or help align the SiPho chip 108 within the chip mounting region 204. In one example, the stand-off structures 1015 (FIG. 10) are formed to help set the vertical alignment of the waveguides 108A with the optical structures 110. In some embodiments, as illustrated in FIG. 10, the PGL substrate 106 includes one or more stand-off structures 1015 that are configured to support the SiPho chip 108 in a direction (e.g., Z-direction) that is substantially perpendicular to a plane that is parallel to the plane in which the optical structures $110_1$-$110_N$ extend (e.g., X-Y-plane).

Figure 12:
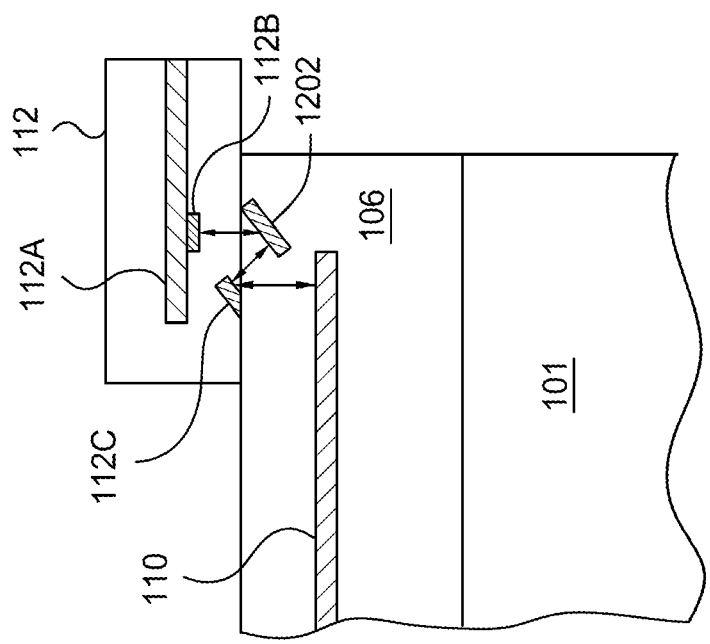
FIG. 12 is a schematic, cross-sectional view of a portion of the pluggable connector formed by use of the section line B-B in FIG. 2A, according to an embodiment.

FIG. 12 is a schematic, cross-sectional lateral view of the fiber connector 112 portion of the photonic engine 103, according to an embodiment. In general, the fiber connector 112 is used to removably connect the external fiber cable 120 to the photonic engine 103. The plurality of optical fibers 112A of the fiber connector 112 transmit light signals to and from the fiber cable 120 plugged into the fiber connector 112. The fiber connector 112 is configured to allow for the attachment of external fiber cable 120 to the optical input/output of the photonic engine 103 without requiring active alignment of the fiber cable 120 to the photonic engine 103 on a per fiber core basis. As such, the fiber connector 120 may be formed and configured to be interoperable with a variety of different fiber cable 120 assemblies and standards.

As shown in FIG. 12, light transmitted along the plurality of fibers 112A is directed to the plurality of optical structures $110_1$-$110_N$ on the PGL substrate 106 by a lens assembly for subsequent transmittance to and through the photonic engine 103. The lens assembly includes a first lens 112B and a third lens 112C formed on the fiber connector 112, and a second lens 1202 formed on the substrate 106. In the embodiment shown, light from the fiber cable 120 is transmitted along the fiber 112A towards the first lens 112B formed near the end of the fiber 112A. The first lens 112B directs light transmitted along the fiber 112A towards the second lens 1202 on the PGL substrate 106. The second lens 1202 on the PGL substrate 106 then reflects and re-direct the light back towards the third lens 112C on the fiber connector 112. The third lens 112C finally reflects and re-directs the light to the optical structures 110 on the PGL substrate 106 for subsequent transmittance through the photonic engine 103.

In summation, embodiments herein relate to optical silicon photonic devices and methods for fabricating optical silicon photonic devices. The methods described herein enable the high volume manufacturing and fabrication of optical silicon photonic devices having a plurality of optical structures formed on a photonic glass layer substrate. The optical silicon photonic device further includes a silicon photonic chip mounted on the photonic glass layer substrate and connected to the plurality of optical structures. The plurality of optical structures optically connect the silicon photonic chip to a fiber connector configured for connecting with an external fiber and operate to propagate light signals between the fiber connector and the silicon photonic chip.

While the foregoing is directed to embodiments of the present disclosure, other and further embodiments of the disclosure may be devised without departing from the basic scope thereof, and the scope thereof is determined by the claims that follow.

What is claimed is:

1. An electronic and photonic device, comprising:
a substrate having an optical transceiver chip mounting region disposed over a first end of the substrate and a fiber region disposed over a second end of the substrate, wherein the substrate comprises
a plurality of optical structures,
each of the plurality of optical structures having:
 a first end disposed under the optical transceiver chip mounting region to be optically connected to a respective waveguide of a plurality of waveguides of an optical transceiver chip, wherein the plurality of optical structures are configured to receive light from or transmit light to the plurality of waveguides of the optical transceiver chip which is to be disposed on the optical transceiver chip mounting region, and
 a second end disposed under the fiber region to be optically connected to a respective fiber of a plurality of optical fibers to receive light from or transmit light to the plurality of optical fibers to be disposed over the fiber region.

2. The electronic and photonic device of claim 1, wherein the plurality of optical structures have a first refractive index and are separated by a second material that has a second refractive index.

3. The electronic and photonic device of claim 1, wherein the optical transceiver chip is connected to the substrate by butt-coupling the plurality of waveguides of the optical transceiver chip and the plurality of optical structures together.

4. The electronic and photonic device of claim 1, wherein the optical transceiver chip is connected to the substrate by evanescent coupling the plurality of waveguides of the optical transceiver chip and the plurality of optical structures together.

5. The electronic and photonic device of claim 1, wherein each of the plurality of optical structures comprises a waveguide that extends from a first edge to a second edge of the substrate, and extends in one or more directions that are parallel to a first plane.

6. The electronic and photonic device of claim 5, wherein the plurality of waveguides of the plurality of optical structures have a cross-sectional area that varies along its length that extends between the first edge and the second edge.

7. The electronic and photonic device of claim 1, wherein the plurality of optical structures comprise a plurality of waveguides that extend from a first edge to a second edge of the substrate, and each of the plurality of waveguides comprises:
 a first end extending from the first edge of the substrate, wherein the first end of the waveguides comprise a first cross-sectional dimension; and
 a second end extending from the second edge the substrate, wherein the second end of the waveguides comprise a second cross-sectional dimension, and the second cross-sectional dimension is greater than the first cross-sectional dimension.

8. The electronic and photonic device of claim 7, wherein the first cross-sectional dimension comprises a height dimension that is about 1 micron in size and the second cross-sectional dimension comprises a height dimension that is about 9 micron in size.

9. The electronic and photonic device of claim 1, wherein the optical transceiver chip mounting region further comprises an array of vias that are configured to be electrically connected to one or more contacts formed on the optical transceiver chip.

10. The electronic and photonic device of claim 9, further comprising:
 a plurality of solder balls for electrically connecting the optical transceiver chip to be disposed over the optical transceiver chip mounting region to a plurality of vias extending through the substrate,
 wherein
  each of the plurality of optical structures comprise a waveguide that extends from the first end to the second end and extends parallel to a first plane, and
  the substrate further comprises one or more stand-off structures that are configured to support the optical transceiver chip in a first direction that is substantially perpendicular to the first plane.

11. The electronic and photonic device of claim 1, further comprising a lens assembly formed between the substrate and the plurality of optical fibers, wherein the lens assembly is operable to transmit light between the plurality of fibers and the plurality of optical structures.

12. The electronic and photonic device of claim 1, wherein the plurality of optical structures are configured to transmit light between optically connected waveguides at the first end and optically connected fibers at the second end.

13. A co-packaged electronic and photonic device comprising:
 a package substrate;
 one or more electrical or opto-electrical integrated circuits mounted on the package substrate; and
 one or more electronic and photonic devices mounted on the package substrate wherein each of the one or more electronic and photonic devices is connected to the one or more of the electrical or opto-electrical integrated circuits,
 wherein each of the one or more electronic and photonic device comprises:

a supporting substrate having a plurality of optical structures;

an optical transceiver chip mounted directly on an optical transceiver chip mounting region of the supporting substrate, the optical transceiver chip having a plurality of waveguides optically connected to the plurality of optical structures of the substrate over a first interface; and an optical fiber connector disposed over a fiber connector region of the supporting substrate, the optical fiber connector having a plurality of optical fibers optically connected to the plurality of optical structures over a second interface, wherein each of the plurality of optical structures is optically connected at the first interface to a respective waveguide of the plurality of waveguides such that each of the plurality of optical structures is configured to transmit light to or receive light from the respective waveguide of the plurality of waveguides, and each of the plurality of optical structures is optically connected at the second interface to a respective optical fiber of the plurality of optical fibers such that each of the plurality of optical structures is configured to transmit light to or receive light transmitted from the respective optical fiber of the plurality of optical fibers.

14. The co-packaged electronic and photonic device of claim 13, wherein the plurality of optical structures have a first refractive index and are separated by a second material that has a second refractive index.

15. The co-packaged electronic and photonic device of claim 13, wherein the optical transceiver chip is connected to the supporting substrate by butt-coupling the plurality of waveguides of the optical transceiver chip and the plurality of optical structures together.

16. The co-packaged electronic and photonic device of claim 13, wherein the optical transceiver chip is connected to the supporting substrate by evanescent coupling the plurality of waveguides of the optical transceiver chip and the plurality of optical structures together.

17. The co-packaged electronic and photonic device of claim 13, wherein the optical transceiver chip is in communication with the plurality of optical structures and in communication with a plurality of metal traces that are connected to the one or more electrical or opto-electrical integrated circuits.

18. The co-packaged electronic and photonic device of claim 13, wherein each of the plurality of optical structures extends parallel to a first plane from the first end to the second end.

19. The co-packaged electronic and photonic device of claim 13, wherein one or more optical structures have an optical transmission region that has a cross-sectional area that varies along its length that extends between first end and the second end.

20. The co-packaged electronic and photonic device of claim 13, wherein each of the one or more electronic and photonic devices is configured to transmit a signal between the optical fiber connector connected to the supporting substrate of the one or more electronic and photonic device and one or more electrical or opto-electrical integrated circuits mounted on the package substrate.

* * * * *